(12) United States Patent
Fountain, Jr. et al.

(10) Patent No.: US 12,500,138 B2
(45) Date of Patent: Dec. 16, 2025

(54) COOLING CHANNEL SHAPE WITH SUBSTANTIALLY CONSTANT CROSS SECTIONAL AREA

(71) Applicant: Adeia Semiconductor Bonding Technologies Inc., San Jose, CA (US)

(72) Inventors: Gaius Gillman Fountain, Jr., Youngsville, NC (US); Pawel Mrozek, San Jose, CA (US); George Carlton Hudson, Wendell, NC (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 18/898,541

(22) Filed: Sep. 26, 2024

(65) Prior Publication Data
US 2025/0329609 A1    Oct. 23, 2025

Related U.S. Application Data

(60) Provisional application No. 63/691,689, filed on Sep. 6, 2024, provisional application No. 63/635,515, filed on Apr. 17, 2024.

(51) Int. Cl.
*H01L 23/46* (2006.01)
*H01L 21/48* (2006.01)
(Continued)

(52) U.S. Cl.
CPC ............ *H01L 23/46* (2013.01); *H01L 21/481* (2013.01); *H01L 23/3675* (2013.01);
(Continued)

(58) Field of Classification Search
CPC ... H01L 23/46; H01L 21/481; H01L 23/3675; H01L 24/08; H01L 23/498; H01L 2224/08225
See application file for complete search history.

(56) References Cited

U.S. PATENT DOCUMENTS

| 4,274,479 A | 6/1981 | Eastman |
| 5,309,986 A | 5/1994 | Itoh |

(Continued)

FOREIGN PATENT DOCUMENTS

| CN | 109524373 A | 3/2019 |
| CN | 111128976 A | 5/2020 |

(Continued)

OTHER PUBLICATIONS

"KoolMicro Inc. developed the World's First 2,000 W/cm2 Cooling Technology for High Heat Generation Chips," Press Release, 2 pages, downloaded from www.semiconductorpackagingnews.com/uploads/1/KoolMicro_High_Cooling_Power_Density.pdf on Nov. 22, 2023.

(Continued)

*Primary Examiner* — Evan G Clinton
*Assistant Examiner* — Corbyn D Mellinger
(74) *Attorney, Agent, or Firm* — HALEY GUILIANO LLP

(57) ABSTRACT

Embodiments herein provide for fluidic cooling assemblies embedded within a device package and related manufacturing methods. In one embodiment, the integrated cooling assembly comprises a semiconductor device and a cold plate directly bonded to a backside of the semiconductor device. The first side of the cold plate includes coolant channels, and a second side of the cold plate comprises at least two openings, defined by opening sidewalls extending away from the second side and towards the first side. The cavity sidewalls and the coolant channels of the first side run in a first direction, the at least two openings on the second side run in a second direction different from the first direction and overlap with portions of the coolant channels on the first side to form a continuous aperture between the second side and the first side of the cold plate.

20 Claims, 21 Drawing Sheets

(51) Int. Cl.
*H01L 23/00* (2006.01)
*H01L 23/367* (2006.01)
*H01L 23/498* (2006.01)

(52) U.S. Cl.
CPC ............ *H01L 24/08* (2013.01); *H01L 23/498* (2013.01); *H01L 2224/08225* (2013.01)

(56) References Cited

U.S. PATENT DOCUMENTS

| | | | |
|---|---|---|---|
| 5,522,452 A | 6/1996 | Mizuno et al. |
| 5,769,154 A | 6/1998 | Adkins et al. |
| 6,056,044 A | 5/2000 | Benson et al. |
| 6,351,384 B1 | 2/2002 | Daikoku et al. |
| 6,686,532 B1 | 2/2004 | Macris |
| 6,822,326 B2 | 11/2004 | Enquist et al. |
| 7,289,326 B2 | 10/2007 | Heydari et al. |
| 7,485,957 B2 | 2/2009 | Brandenburg et al. |
| 7,511,372 B2 | 3/2009 | Chiu |
| 7,523,617 B2 | 4/2009 | Venkatasubramanian et al. |
| 7,622,324 B2 | 11/2009 | Enquist et al. |
| 7,692,926 B2 | 4/2010 | Henderson et al. |
| 7,957,137 B2 | 6/2011 | Prasher |
| 7,978,473 B2 | 7/2011 | Campbell et al. |
| 7,997,087 B2 | 8/2011 | Venkatasubramanian et al. |
| 8,164,169 B2 | 4/2012 | Chrysler et al. |
| 8,630,091 B2 | 1/2014 | Ward et al. |
| 9,224,673 B2 | 12/2015 | Chen et al. |
| 9,299,641 B2 | 3/2016 | Sekar et al. |
| 9,355,932 B2 | 5/2016 | Ankireddi et al. |
| 9,391,143 B2 | 7/2016 | Tong et al. |
| 9,553,071 B1 | 1/2017 | Haba |
| 9,741,638 B2 | 8/2017 | Hsieh et al. |
| 9,741,696 B2 | 8/2017 | Katkar et al. |
| 9,746,248 B2 | 8/2017 | Semenov et al. |
| 9,768,149 B2 | 9/2017 | Vadhavkar et al. |
| 9,818,723 B2 | 11/2017 | Haba |
| 10,032,695 B2 | 7/2018 | Iyengar et al. |
| 10,083,934 B2 | 9/2018 | Haba |
| 10,157,818 B2 | 12/2018 | Chen et al. |
| 10,170,392 B2 | 1/2019 | Chainer et al. |
| 10,199,356 B2 | 2/2019 | Kinsley |
| 10,312,221 B1 | 6/2019 | Agarwal et al. |
| 10,332,823 B2 | 6/2019 | Chen et al. |
| 10,461,059 B2 | 10/2019 | Koopmans et al. |
| 10,694,641 B2 | 6/2020 | Basu et al. |
| 10,943,851 B1* | 3/2021 | Elsherbini ........... H01L 25/0652 |
| 10,978,427 B2 | 4/2021 | Li et al. |
| 11,187,469 B2 | 11/2021 | Karesh |
| 11,387,164 B2 | 7/2022 | Wu et al. |
| 11,598,594 B2 | 3/2023 | Lewis et al. |
| 11,996,351 B2 | 5/2024 | Hsiao et al. |
| 2003/0157782 A1 | 8/2003 | Kellar et al. |
| 2004/0184237 A1 | 9/2004 | Chang |
| 2004/0251530 A1 | 12/2004 | Yamaji |
| 2005/0126766 A1 | 6/2005 | Lee et al. |
| 2005/0213301 A1 | 9/2005 | Prasher |
| 2006/0042825 A1 | 3/2006 | Lu et al. |
| 2006/0103011 A1 | 5/2006 | Andry et al. |
| 2007/0025082 A1 | 2/2007 | Lee et al. |
| 2007/0107875 A1 | 5/2007 | Lee et al. |
| 2008/0096320 A1 | 4/2008 | Farrar |
| 2009/0122491 A1 | 5/2009 | Martin et al. |
| 2010/0116534 A1 | 5/2010 | Choi et al. |
| 2010/0230805 A1 | 9/2010 | Refai-Ahmed |
| 2010/0300202 A1 | 12/2010 | Joyce |
| 2011/0129986 A1 | 6/2011 | Libralesso et al. |
| 2011/0205707 A1* | 8/2011 | Kharazmi ............ H01L 23/473 361/699 |
| 2013/0044431 A1 | 2/2013 | Koeneman |
| 2013/0050944 A1 | 2/2013 | Shepard |
| 2013/0087904 A1 | 4/2013 | Clark et al. |
| 2014/0126150 A1 | 5/2014 | Song et al. |
| 2015/0194363 A1 | 7/2015 | Jun et al. |
| 2016/0276314 A1 | 9/2016 | Ching et al. |
| 2017/0012016 A1 | 1/2017 | Joshi et al. |
| 2017/0092565 A1 | 3/2017 | Chen et al. |
| 2017/0103937 A1 | 4/2017 | Hsieh et al. |
| 2018/0053730 A1 | 2/2018 | Shao et al. |
| 2018/0087842 A1 | 3/2018 | Chainer et al. |
| 2018/0090427 A1 | 3/2018 | Bernstein et al. |
| 2018/0160565 A1 | 6/2018 | Parida |
| 2018/0211900 A1 | 7/2018 | Gutala et al. |
| 2018/0308783 A1 | 10/2018 | Refai-Ahmed et al. |
| 2019/0008071 A1 | 1/2019 | Kim |
| 2019/0341327 A1 | 11/2019 | Teysseyre |
| 2019/0355706 A1 | 11/2019 | Enquist et al. |
| 2019/0385928 A1 | 12/2019 | Leobandung |
| 2020/0035583 A1 | 1/2020 | Beauchemin et al. |
| 2020/0105639 A1 | 4/2020 | Valavala et al. |
| 2020/0312742 A1 | 10/2020 | Lofgreen et al. |
| 2020/0343160 A1 | 10/2020 | Mizerak et al. |
| 2020/0350233 A1 | 11/2020 | Mizerak et al. |
| 2020/0352053 A1 | 11/2020 | Mizerak et al. |
| 2020/0395313 A1 | 12/2020 | Mallik et al. |
| 2021/0066164 A1 | 3/2021 | Wu et al. |
| 2021/0175143 A1 | 6/2021 | Yu et al. |
| 2021/0183741 A1 | 6/2021 | Jha et al. |
| 2021/0193548 A1 | 6/2021 | Wan et al. |
| 2021/0193620 A1 | 6/2021 | Refai-Ahmed et al. |
| 2021/0280497 A1 | 9/2021 | Brun et al. |
| 2021/0288037 A1 | 9/2021 | Tao et al. |
| 2021/0378106 A1 | 12/2021 | Iyengar et al. |
| 2021/0378139 A1 | 12/2021 | Rice et al. |
| 2021/0407888 A1* | 12/2021 | Elsherbini ............. H01L 23/473 |
| 2021/0410329 A1 | 12/2021 | Yang et al. |
| 2022/0037231 A1 | 2/2022 | Hsiao et al. |
| 2022/0087059 A1 | 3/2022 | Sathyamurthy et al. |
| 2022/0117115 A1 | 4/2022 | Malouin et al. |
| 2022/0130734 A1 | 4/2022 | Chiu et al. |
| 2022/0189850 A1 | 6/2022 | Liff et al. |
| 2022/0210949 A1 | 6/2022 | Edmunds et al. |
| 2022/0230937 A1 | 7/2022 | Malouin et al. |
| 2022/0408592 A1 | 12/2022 | Malouin et al. |
| 2023/0048500 A1 | 2/2023 | Malouin et al. |
| 2023/0154828 A1 | 5/2023 | Haba et al. |
| 2023/0156959 A1 | 5/2023 | Malouin et al. |
| 2023/0207474 A1 | 6/2023 | Uzoh et al. |
| 2023/0245950 A1 | 8/2023 | Haba et al. |
| 2023/0284421 A1 | 9/2023 | Malouin et al. |
| 2023/0298969 A1* | 9/2023 | Park ..................... H01L 23/433 257/712 |
| 2024/0038633 A1 | 2/2024 | Haba et al. |
| 2024/0130077 A1* | 4/2024 | Nie ....................... H01L 23/473 |
| 2024/0203823 A1 | 6/2024 | Uzoh et al. |
| 2024/0222222 A1 | 7/2024 | Haba et al. |
| 2024/0222226 A1 | 7/2024 | Haba |
| 2024/0249995 A1 | 7/2024 | Haba |
| 2024/0249998 A1 | 7/2024 | Gao et al. |
| 2024/0266255 A1 | 8/2024 | Haba et al. |

FOREIGN PATENT DOCUMENTS

| | | |
|---|---|---|
| CN | 115719735 A | 2/2023 |
| JP | 2000-340727 A | 12/2000 |
| KR | 10-1049508 B1 | 7/2011 |
| KR | 10-2022-0033979 * | 3/2022 |
| KR | 10-2023-0136509 A | 9/2023 |
| TW | 200834871 A | 8/2008 |
| WO | 2013/097146 A1 | 7/2013 |
| WO | 2024/145475 A1 | 7/2024 |

OTHER PUBLICATIONS

"Single-Phase Direct-to-Chip Liquid Cooling," 6 pages, downloaded from https://jetcool.com/post/single-phase-direct-to-chip-liquid-cooling-microconvective-vs-microchannel-liquid-cooled-cold-plates/ on Mar. 7, 2024.

"Microconvective Liquid Cooling for high power electronics," https://jetcool.com/technology/, downloaded Mar. 7, 2024, 6 pages.

Benson D.A. et al., "Micro-Machined Heat Pipes in Silicon MCM Substrates", Sandia National Laboratories, Sandia Report: SAND97-0100-UC-704, printed Jan. 1997, 17 pages.

(56) References Cited

OTHER PUBLICATIONS

International Search Report and Written Opinion mailed Jun. 5, 2024, in International Application No. PCT/ US2024/013758, 9 pages.
International Search Report and Written Opinion mailed Mar. 16, 2023, in International Application No. PCT/ US2022/050105, 9 pages.
International Search Report and Written Opinion mailed May 30, 2023, in International Application No. PCT/ US2023/061494, 9 pages.
Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 7 pages.
Walsh, Stephen Michael, "Microjet Impingement Cooling of High Power-Density Electronics," Thesis, submitted May 11, 2018, 93 pages.
Evan G. Colgan, "A Practical Implementation of Silicon Microchannel Coolers", available online at <https://www.electronics-cooling.com/2007/11/a-practical-implementation-of-silicon-microchannel-coolers/>, Nov. 1, 2007, 10 pages.
Francisco Pires, "TSMC Exploring On-Chip, Semiconductor-Integrated Watercooling", tom's Hardware, retrieved from https://www.tomshardware.com/news/tsmc-exploring-on-chip-semiconductor-integrated-watercooling, Jul. 13, 2021, 23 pages.
IBM, "Functional electronic packaging-Thermal management roadmap", available online at <https://web.archive.org/web/20170220095511/https://www.zurich.ibm.com/st/electronicpackaging/cooling.html>, Feb. 20, 2017, 7 pages.
International Search Report and Written Opinion received for PCT Patent Application No. PCT/US23/28942, mailed on Nov. 16, 2023, 12 pages.
International Search Report and Written Opinion received for PCT Patent Application No. PCT/US23/84874, mailed on Apr. 22, 2024, 7 pages.
International Search Report and Written Opinion received for PCT Patent Application No. PCT/US23/85801, mailed on Apr. 26, 2024, 8 pages.
International Search Report and Written Opinion received for PCT Patent Application No. PCT/US23/85816, mailed on Apr. 23, 2024, 11 pages.
International Search Report and Written Opinion received for PCT Patent Application No. PCT/US23/86233, mailed on Apr. 26, 2024, 7 pages.
Kaplan, F. et al., "LoCool: Fighting Hot Spots Locally for System Energy Efficiency" IEEE Transactions on Computer-Aided Design of Intergrated Circuits and Systems, 39(4):895-908 (2020).
U.S. Appl. No. 18/129,567, filed Mar. 31, 2023, First Name Inventor: Cyprian Emeka Uzoh, "Embedded Cooling Systems for Device Packages and Methods of Cooling Packaged Devices".
PCT Application No. PCT/US2024/022253, International Search Report and Written Opinion dated Jul. 17, 2024, 14 pages.
Shamsa, M., et al., "Thermal conductivity of diamond-like carbon films", Applied Physics Letters, vol. 89, No. 16, Oct. 20, 2006, pp. 161921-161921-3.
Wu, C. J., et al., "Ultra High Power Cooling Solution for 3D-Ics", 2021 Symposium on VLSI Technology, Jun. 2021, 2 pages.
U.S. Appl. No. 18/784,639, filed Jul. 25, 2024, First Name Inventor: Gaius Gillman Fountain, "Fabrication Methods and Structures for Liquid Cooling Channel Chip".
U.S. Appl. No. 18/788,853, filed Jul. 30, 2024, First Name Inventor: Ron Zhang, "Fluid Channel Geometry Optimizations To Improve Cooling Efficiency".

\* cited by examiner

COOLING CHANNEL SHAPE WITH SUBSTANTIALLY CONSTANT CROSS SECTIONAL AREA

CROSS-REFERENCE TO RELATED APPLICATIONS

This application claims the benefit of U.S. Provisional Patent Application No. 63/635,515, filed Apr. 17, 2024, and U.S. Provisional Patent Application No. 63/691,689, filed Sep. 6, 2024, both of which are incorporated by reference herein in their entireties.

FIELD

The present disclosure relates to advanced packaging for microelectronic devices, and in particular, cooling systems for device packages and methods of manufacturing the same.

BACKGROUND

Energy consumption poses a critical challenge for the future of large-scale computing as the world's computing energy requirements are rising at a rate that most would consider unsustainable. Some models predict that the information, communication and technology (ICT) ecosystem could exceed 20% of global electricity use by 2030, with direct electrical consumption by large-scale computing centers accounting for more than one-third of that energy usage. A significant portion of the energy used by such large-scale computing centers is devoted to cooling, since even small increases in operating temperatures can negatively impact the performance of microprocessors, memory devices, and other electronic components. While some of this energy is expended to operate the cooling systems that are directly cooling the chips (e.g., heat spreaders, heat pipes, etc.), energy consumption/costs for indirect cooling can also be quite staggering. Indirect cooling energy costs include, for example, cooling or air conditioning of data center buildings. Data center buildings can house thousands, to tens of thousands or more, of high performance chips in server racks, and each of those high performance chips is a heat source. An uncontrolled ambient temperature in a data center will adversely affect the performance of the individual chips, and the data center system performance as a whole.

Thermal dissipation in high-power density chips (semiconductor devices/die) is also a critical challenge as improvements in chip performance, e.g., through increased gate or transistor density due to advanced processing nodes, evolution of multi-core microprocessors, etc., have resulted in increased power density and a corresponding increase in thermal flux that contributes to elevated chip temperatures. Higher density of transistors also increases the length of metal wiring on the chips, which generates its own additional thermal flux due to Joule heating of these wires due to higher currents. These elevated temperatures are undesirable as they can degrade the chip's operating performance, efficiency, reliability, and amount of remaining life. Cooling systems used to maintain the chip at a desired operating temperature typically remove heat using one or more heat dissipation devices, e.g., thermal spreaders, heat pipes, cold plates, liquid cooled heat pipe systems, thermal-electric coolers, heat sinks, etc. One or more thermal interface material(s), such as, for example, thermal paste, thermal adhesive, or thermal gap filler, may be used to facilitate heat transfer between the surfaces of a chip and heat dissipation device(s). A thermal interface material(s) (TIM(s)) is any material that is inserted between two components to enhance the thermal coupling therebetween. Unfortunately, the combined thermal resistance of (i) the thermal resistance of interfacial boundary regions between a TIM(s) and the chip and/or the heat dissipation device(s), and (ii) the thermal resistance of a thermal interface material(s) itself can inhibit heat transfer from the chip to the heat dissipation devices, undesirably reducing the cooling efficiency of the cooling system.

Generally speaking, there are multiple components between the heat dissipating sources (i.e., active circuitry) in the chips and the heat dissipation devices, each of which contributes to the system thermal resistance cumulatively along the heat transfer paths and raises chip junction temperatures from the ambient.

Such cooling systems can suffer from reduced cooling efficiency due to the design and manufacture of system components.

Accordingly, there exists a need in the art for improved energy-efficient cooling systems, by reducing system thermal resistance, and methods of manufacturing the same.

SUMMARY

Embodiments herein provide integrated cooling assemblies embedded in advanced device packages. Advantageously, the integrated device cooling assemblies deliver appropriate cooling directly to a semiconductor device to obtain effective cooling of the device.

A first general aspect includes an integrated cooling assembly comprising a semiconductor device and a cold plate directly bonded to a backside of the semiconductor device. The cold plate comprises a perimeter sidewall which extends downwardly from a first side of the cold plate to the backside of the semiconductor device to define a perimeter of the cold plate, the first side of the cold plate comprises a cavity divider comprising cavity sidewalls, and the cavity divider extends downwardly from the first side towards the backside. The first side, the cavity sidewalls, the perimeter sidewall and the backside of the semiconductor device collectively define coolant channels therebetween and a second side of the cold plate opposite the first side comprises at least two openings, the at least two openings defined by opening sidewalls extending away from the second side and towards the first side. The cavity sidewalls and the coolant channels of the first side extend in a first direction, and the at least two openings on the second side extend in a second direction different from the first direction and overlap with portions of the coolant channels on the first side to form separate apertures between each of the coolant channels on the first side and the at least two openings on the second side.

Implementations of the integrated cooling assembly according to the first general aspect may include one or more of the following features. The at least two openings allow ingress into and egress out of each of the coolant channels on the second side of the cold plate. The cavity dividers of the first side extend across the apertures in the cold plate to form dedicated inlet and outlet openings for each coolant channel. Each coolant channel has a triangular cross-section defined by respective pairs of opposing cavity sidewalls and the backside of the semiconductor device. Each pair of opposing cavity sidewalls extend downwardly from the first side to a depth of about 0.5 mm. The first side of the cold plate is attached to the semiconductor device by direct dielectric bonds. The first side of the cold plate is attached to the semiconductor device by direct hybrid bonds. The second direction is substantially perpendicular to the first direction so that the at least two openings on the second side of the cold plate are substantially perpendicular to the coolant channels of the first side. The at least two openings on the second side comprise two openings. The two openings are disposed in line with first and second ends of the coolant channels.

The at least two openings on the second side comprise three openings. Two of the three openings are disposed vertically in line with the first and second ends of the coolant channels and a third opening is disposed vertically in line with the midpoint of the coolant channels. Surfaces of the cavity sidewalls are sloped away from the first side at an angle less than 90 degrees. A portion of each coolant channel adjacent an aperture in the cold plate includes a tapered section. The tapered section has a substantially triangular shape. The at least two openings on the second side are in fluid communication with the coolant channels by way of the apertures.

One of the at least two openings comprises an inlet and one of the at least two openings comprises an outlet. The integrated cooling assembly may further comprise a package substrate upon which the integrated cooling assembly is disposed, a package cover extending over the integrated cooling assembly so that the integrated cooling assembly is disposed between the package substrate and the package cover, and the package cover comprises an inlet opening and an outlet opening disposed therethrough, each coolant channel is in fluid communication with the inlet opening and the outlet opening.

The integrated cooling assembly may further comprise a sealing material layer that surrounds an interface between the semiconductor device and the package substrate. The integrated cooling assembly may comprise plural semiconductor devices and the cold plate is attached to the plural semiconductor devices.

A second general aspect includes a method of manufacturing a cold plate. The method comprises patterning a first side of a substrate to form first opening patterns, patterning a second side of the substrate opposite the first side to form second opening patterns, and forming a cold plate by etching the first and second sides of the substrate such that the first opening patterns on the first side of the substrate form a cavity divider comprising cavity sidewalls and coolant channels, and the second opening patterns on the second side of the substrate form at least two openings, the at least two openings defined by opening sidewalls extending away from the second side and towards the first side. The cavity sidewalls and the coolant channels of the first side extend in a first direction, and the at least two openings on the second side extend in a second direction different from the first direction and overlap with portions of the coolant channels on the first side to form separate apertures between each of the coolant channels on the first side and the at least two openings on the second side.

Implementations of the method of the second aspect may include the following features. Second opening patterns are perpendicular to the first opening patterns. Etching the first and second sides of the substrate comprises concurrently etching the first and second sides of the cold plate. The etching is anisotropic wet etching.

BRIEF DESCRIPTION OF THE DRAWINGS

The above and other objects and advantages of the disclosure will be apparent upon consideration of the following detailed description, taken in conjunction with the accompanying drawings, in which.

Figure 1:
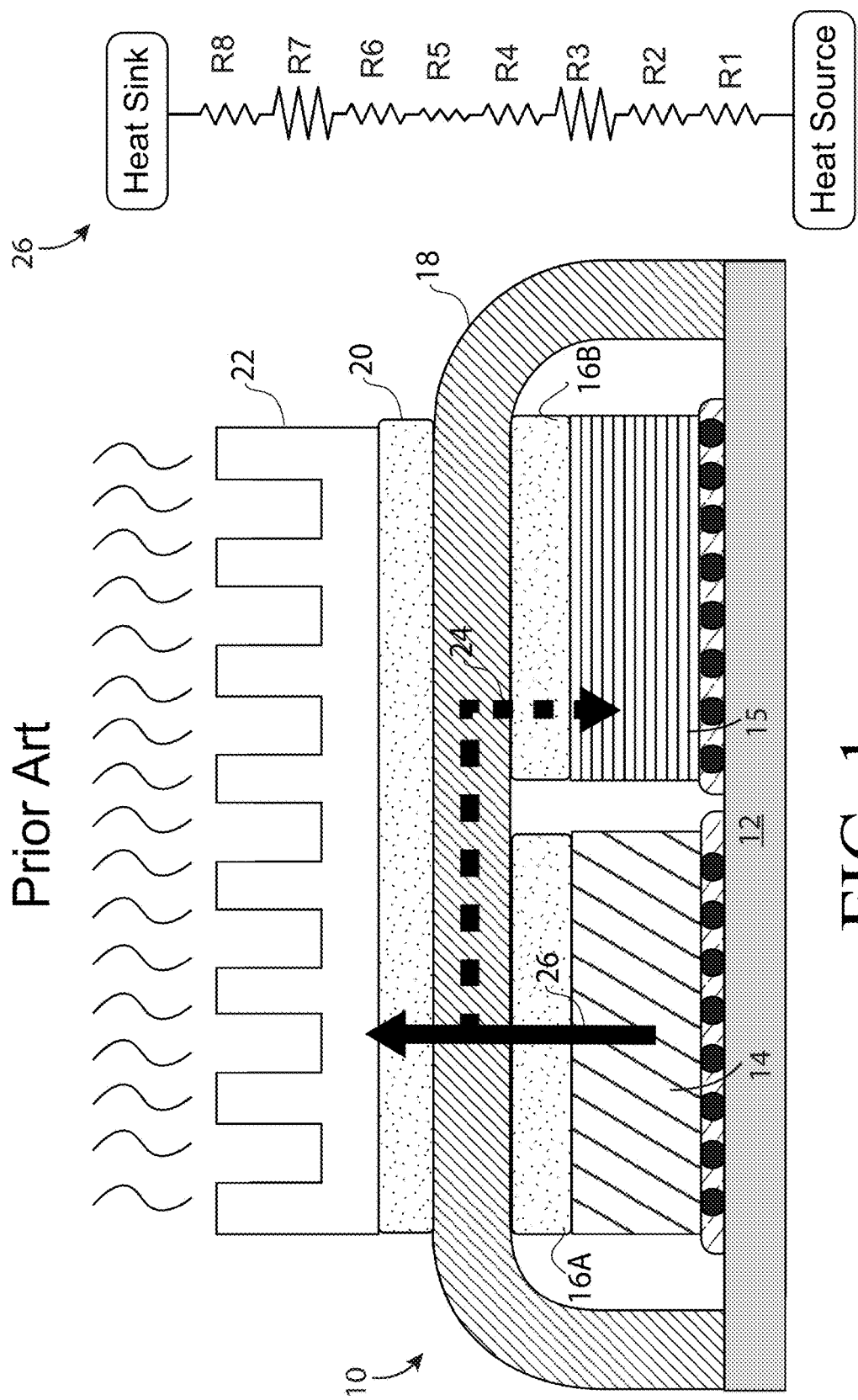
FIG. 1 illustrates a device package with an external heat sink.

The figures herein depict various embodiments of the present disclosure for purposes of illustration only. It will be appreciated that additional or alternative structures, assemblies, systems, and methods may be implemented within the principles set out by the present disclosure.

DETAILED DESCRIPTION

As used herein, the term "substrate" means and includes any workpiece, wafer, or article that provides a base material or supporting surface from which or upon which components, elements, devices, assemblies, modules, systems, or features of the heat-generating devices, packaging components, and cooling assembly components described herein may be formed or mounted. The term "substrate" also includes semiconductor substrates that provide a supporting material upon which elements of a semiconductor device are fabricated or attached, and any material layers, features, and/or electronic devices formed thereon, therein, or therethrough. Examples of substrate material that may be used in applications that generate high thermal density include, but are not limited to, Si, GaN, SiC, InP, GaP, InGaN, AlGaInP, AlGaAs, etc.

As described below, the semiconductor substrates herein generally have a "device side," e.g., the side on which semiconductor device elements are fabricated, such as transistors, resistors, and capacitors, and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that forms the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal, e.g., after substrate thinning operations. Depending on the stage of device fabrication or assembly, the terms "active sides" and "non-active sides" are also used to describe surfaces of material layers or features formed on, in, or through the semiconductor substrate, whether or not the material layers or features are ultimately present in the fabricated or assembled device. For example, in some instances, the term "active side" is used to indicate a surface of a substrate that will in the future, but does not yet, include semiconductor device elements.

Spatially relative terms are used herein to describe the relationships between elements, such as the relationships between substrates, heat-generating devices, cooling assembly components, device packaging components, and other features described below. Unless the relationship is otherwise defined, terms such as "above," "over," "upper," "upwardly," "outwardly," "on," "below," "under," "beneath," "lower," "top," "bottom" and the like are generally made with reference to the X, Y, and Z directions set forth by X, Y and Z axes in the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," and the like, either alone or in combination with a spatially relevant term, include both relationships with intervening elements and direct relationships where there are no intervening elements. Furthermore, the term "horizontal" is generally made with reference to the X-axis direction and the Y-axis direction set forth in the drawings. The term "vertical" is generally made with reference to the Z-axis direction set forth in the drawings.

Various embodiments disclosed herein include bonded structures in which two or more elements are directly bonded to one another without an intervening adhesive (referred to herein as "direct bonding," "direct dielectric bonding," or "directly bonded"). The resultant bonds formed by this technique may be described as "direct bonds" and/or "direct dielectric bonds". In some embodiments, direct bonding includes the bonding of a single material on the first of the two or more elements and a single material on a second one of the two or more elements, where the single material on the different elements may or may not be the same. For example, bonding a layer of one inorganic dielectric (e.g., silicon oxide) to another layer of the same or different inorganic dielectric. As discussed in more detail below, the process of direct bonding (e.g., direct dielectric bonding) provides a reduction of thermal resistance between a semiconductor device and a cold plate. Examples of dielectric materials used in direct bonding include oxides, nitrides, oxynitrides, carbonitrides, and oxycarbonitrides, etc., such as, for example, silicon oxide, silicon nitride, silicon oxynitride, silicon carbonitride, silicon oxycarbonitride, etc. Direct bonding can also include bonding of multiple materials on one element to multiple materials on the other element (e.g., hybrid bonding). As used herein, the term "hybrid bonding" refers to a species of direct bonding having both i) at least one (first) nonconductive feature directly bonded to another (second) nonconductive feature, and ii) at least one (first) conductive feature directly bonded to another (second) conductive feature, without any intervening adhesive. The resultant bonds formed by this technique may be described as "hybrid bonds" and/or "direct hybrid bonds". In some hybrid bonding embodiments, there are many first conductive features, each directly bonded to a second conductive feature, without any intervening adhesive. In some embodiments, nonconductive features on the first element are directly bond to nonconductive features of the second element at room temperature without any intervening adhesive, which is followed by bonding of conductive features of the first element directly bonded to conductive features of the second element via annealing at slightly higher temperatures (e.g., >100° C., >200° C., >250° C., >300° C., etc.)

Unless otherwise noted, the terms "cooling assembly" and "integrated cooling assembly" generally refer to a semiconductor device and a cold plate attached to the semiconductor device. Typically, the cold plate is formed with recessed surfaces that define one or more fluid cavities (e.g., coolant chamber volume(s) or coolant channel(s)) between the cold plate and the semiconductor device. In embodiments where the cold plate is formed with plural fluid cavities, each fluid cavity may be defined by cavity dividers and/or sidewalls of the cold plate. For example, cavity dividers may be spaced apart from each other and extend laterally between opposing cold plate sidewalls (e.g., in one direction between a first pair of opposing cold plate sidewalls, or in two directions between orthogonal pairs of opposing cold plate sidewalls). The cavity dividers and the cold plate sidewalls may collectively define adjacent fluid cavities therebetween. The cold plate may comprise a polymer material.

The cold plate may be attached to the semiconductor device by use of a compliant adhesive layer or by direct bonding or hybrid bonding. Direct bonding may include direct dielectric bonding techniques as described herein, and may give rise to direct dielectric bonds. Hybrid bonding may include hybrid bonding techniques as described herein, and may give rise to direct hybrid bonds.

For example, the cold plate may include material layers and/or metal features that facilitate direct bonding or hybrid bonding with the semiconductor device. Beneficially, the backside of the semiconductor device is directly exposed to coolant fluids flowing through the integrated cooling assembly, thus providing for direct heat transfer therebetween. Unless otherwise noted, the integrated cooling assemblies described herein may be used with any desired fluid, e.g., liquid, gas, and/or vapor-phase coolants, such as water, glycol, etc.

Exemplary fluids available for use in the various thermal solution embodiments include: water (either purified or deionized), a glycol (e.g., ethylene glycol, propylene glycol), glycols mixed with water (e.g., ethylene glycol mixed with water (EGW) or propylene glycol mixed with water (PGW)), dielectric fluids (e.g. fluorocarbons, polyalphaolefin (PAO), isoparaffins, synthetic esters, or very high viscosity index (VHVI) oils), or mineral oils. Additionally, depending upon design and operating conditions, these fluids may be used in single-phase liquid, single-phase vapor, two-phase liquid/vapor or two-phase solid/liquid. All of these fluids and fluid mixtures will alter the thermohydraulic and heat transfer properties by altering the temperatures where phase change occurs, as well as meeting design temperature and pressure conditions for the component being cooled or warmed and the thermal solution being deployed. Additionally, multiple combinations of the fluid phases may be employed in various hybrid configurations to meet the particular cooling or warming needs of a respective implementation and still be within the scope of the contemplated embodiments.

Additionally, in some embodiments part or all the cooling is provided by gases. Exemplary gases include atmospheric air and/or one or more inert gases such as nitrogen. Atmospheric air may be taken to mean the mixture of different gases in Earth's atmosphere made up of about 78% nitrogen and 21% oxygen.

Depending on the design needs of a thermal solution system using the disclosed embodiments, engineered dielectric cooling fluids may be used. Some examples of dielectric fluids used for cooling semiconductors include: 3M™ Fluorinert™ Liquid FC-40—A non-flammable, dielectric fluid that can be used in direct contact with live electronics; 3M™ Novec™ Engineered Fluids—A non-flammable, dielectric fluid that can be used in direct contact with live electronics; Galden® PFPE (perfluoropolyether) products used as heat transfer fluids; EnSolv Fluoro HTF—A solvent with a high boiling point and low pour point that can be used for semiconductor wafer cooling. It is understood that in the selection of the cooling fluid, system design aspects such as operating temperatures and pressures, fluid flow rates, fluid viscosity, and other properties will require evaluation when selecting the appropriate cooling fluid.

In some embodiments, the cooling fluids may contain microparticles and/or nanoparticle additives to enhance the conductivity of the cooling fluid within the integrated cooling assemblies. Choi and Eastman (1995) from Argonne National Laboratory, U.S.A. (Yu et al., 2007) coined the word "nanofluid". Nanofluids are engineered fluids prepared by suspending the nano-sized (1-100 nm) particles of metals/non-metals and their oxide(s) with a base/conventional fluid. The suspension of high thermal conductivity metals/non-metals and their oxides nanoparticles enhances the thermal conductivity and heat transfer ability, etc. of the base fluid. The additives to the underlying cooling fluid may comprise for example, nanoparticles of carbon nanotube, nanoparticles of graphene, or nanoparticles of metal oxides. When the cooling fluid contains microparticles, the microparticles are typically 10 microns or less in diameter. Silicon oxide microparticles may be used.

The volume concentration of these micro or nanoparticles may be less than 1%, less than 0.2%, or less than 0.05%. Depending upon the liquid and micro/nanoparticle type chosen for the cooling fluid, higher volume concentrations of 10% or less, 5% or less, or 2% or less may be used. The cooling fluids may also contain small amounts of glycol or glycols (e.g. propylene glycol, ethylene glycol etc.) to reduce frictional shear stress and drag coefficient in the cooling fluid within the integrated cooling assembly. The availability of different base fluids (e.g., water, ethylene glycol, mineral or other stable oils, etc.) and different nanomaterials provide a variety of nanomaterial options for nanofluid solutions to be used in the various embodiments. These nanomaterial option groups such as aforementioned metals (e.g., Cu, Ag, Fe, Au, etc.), metal oxides (e.g., $TiO_2$, $Al_2O_3$, CuO, etc.), carbons (e.g. CNTS, graphene, diamond, graphite . . . etc.), or a mixture of different types of nanomaterials. Metal nanoparticles (Cu, Ag, Au . . . ), metal oxide nanoparticles ($Al_2O_3$, $TiO_2$, CuO), and carbon-based nanoparticles are commonly employed elements. Silicon oxide nanoparticles may also be used. Using cooling fluids with micro and/or nanoparticles when practicing the various embodiments disclosed herein can result in increased heat removal efficiencies and effectiveness.

The fluid control design aspects of specific embodiments may require the nanofluids to be magnetic to facilitate either movement or cessation of movement of the fluids within the semiconductor structures. Magnetic nanofluids (MNFs) are suspensions of a non-magnetic base fluid and magnetic nanoparticles. Magnetic nanoparticles may be coated with surfactant layers such as oleic acid to reduce particle agglomeration and/or settling. Magnetic nanoparticles used in MNFs are usually made of metal materials (ferromagnetic materials) such as iron, nickel, cobalt, as well as their oxides such as spinel-type ferrites, magnetite ($Fe_3O_4$), and so forth. The magnetic nanoparticles used in MNFs typically range in size from about 1 to 100 nanometers (nm).

This disclosure describes embodiments involving the architecture of system and component elements that can be employed to provide for the cooling of semi-conductor components, packaging, and boards. However, those skilled in the art will appreciate the disclosed components and arrangements can be deployed and used in scenarios where component heat up or thermal warm up is desired for a component that is currently outside the low end of the desired operational range. Components that are outside the low end of their operational range can, if started in a cold environment, experience thermal warping or cracking up to and including thermal overexpansion and contact separation that may impair the successful operation of the system. Therefore, in these scenarios, the architectures and embodiments disclosed herein can be used where the indirect thermal solutions supporting them are repurposed or operated in a hybrid configuration to provide warming fluids or heat transfer media to accomplish the warm-up or heat-up scenario. These scenarios are controlled by systems not shown here to bring temperatures up at a speed or timing that enables the materials to avoid the excessive thermal expansion or unequal thermal expansion that may occur among the materials of the semiconductor or packaging being serviced by the thermal solution. Once the component or packaging is brought up into the normal operating range, it can be safely started and brought to a useful operational state.

Considering the warm-up or heat-up embodiments introduced above, the balance of this disclosure and terms used should be viewed in a light that also considers the design option for such warm-up or heat-up. Thus, where terms such as cooling channel, cooling chamber volume, and cooling port are used, for example, such terms could also be considered as a thermal control channel, a thermal control volume, or a thermal control port, respectively. A person of skill would understand that heat flux or heat transfer would go in a different direction, but the design concepts are similar and can be successfully employed in the various embodiments.

In some embodiments, a cooling channel is a liquid cooling channel, and a liquid may flow through the liquid cooling channel. In some embodiments, the liquid may comprise a water and/or glycol (e.g., propylene glycol, ethylene glycol, and mixtures thereof).

As described below, coolant fluid flowing through a cold plate may be used to control the temperature of semiconductor devices. The fluid flowing across the surface of the semiconductor device absorbs heat and conducts heat away from the semiconductor device.

FIG. 1 is a schematic side view of a device package 10 and a heat sink 22 attached to the device package 10. The device package 10 typically includes a package substrate 12, a first device 14, a device stack 15, a heat spreader 18, and first TIM layers 16A, 16B thermally coupling the first device 14 and the device stack 15 to the heat spreader 18. The device package 10 is thermally coupled to the heat sink 22 through a second TIM layer 20. The TIM layers 16A, 16B, 20 facilitate thermal contact between components in the device package 10 and between the device package 10 and the heat sink 22.

As heat flux density increases with increasing power density in advanced semiconductor devices, the cumulative thermal resistance of the system illustrated in FIG. 1 is increasingly problematic as heat cannot be dissipated quickly enough to allow semiconductor devices to run at optimal power. Consequently, the energy efficiency of semiconductor devices is reduced. Furthermore, heat is transferred between semiconductor devices within the device package 10, as shown with heat transfer path 24 (illustrated as a dashed line), where heat may be undesirably transferred from the first device 14 having a high heat flux, such as a central processing unit (CPU) or a graphical processing unit (GPU), to the device stack 15 having low heat flux, such as memory, through the heat spreader 18.

For example, as shown in FIG. 1, each device package component and the respective interfacial boundaries therebetween have a corresponding thermal resistance that forms heat transfer path 26 (illustrated by arrow 26 in FIG. 1). The right-hand side of FIG. 1 illustrates the heat transfer path 26 as a series of thermal resistances R1-R8 between a heat source and a heat sink. Here, R1 is the thermal resistance of the bulk semiconductor material of the first device 14. R3 and R7 are the thermal resistances of the first TIM layers 16A, 16B and the second TIM layer 20, respectively. R5 is the thermal resistance of the heat spreader 18. R2, R4, R6, and R8 represent the thermal resistance at the interfacial region of the components (e.g., contact resistances). In a typical cooling system, R3 and R7 may account for 80% or more of the cumulative thermal resistance of the heat transfer path 26, and R5 may account for 5% or more. R1 of the first device 14 and R2, R4, R6, and R8 of the interfaces account for the remaining cumulative thermal resistance. Accordingly, embodiments described herein provide for integrated cooling assemblies embedded within a device package. The embedded cooling assemblies shorten the thermal resistance path between a semiconductor device and a heat sink and reduce thermal communication between semiconductor devices disposed in the same device package, such as described in relation to the figures below.

Figure 2A:
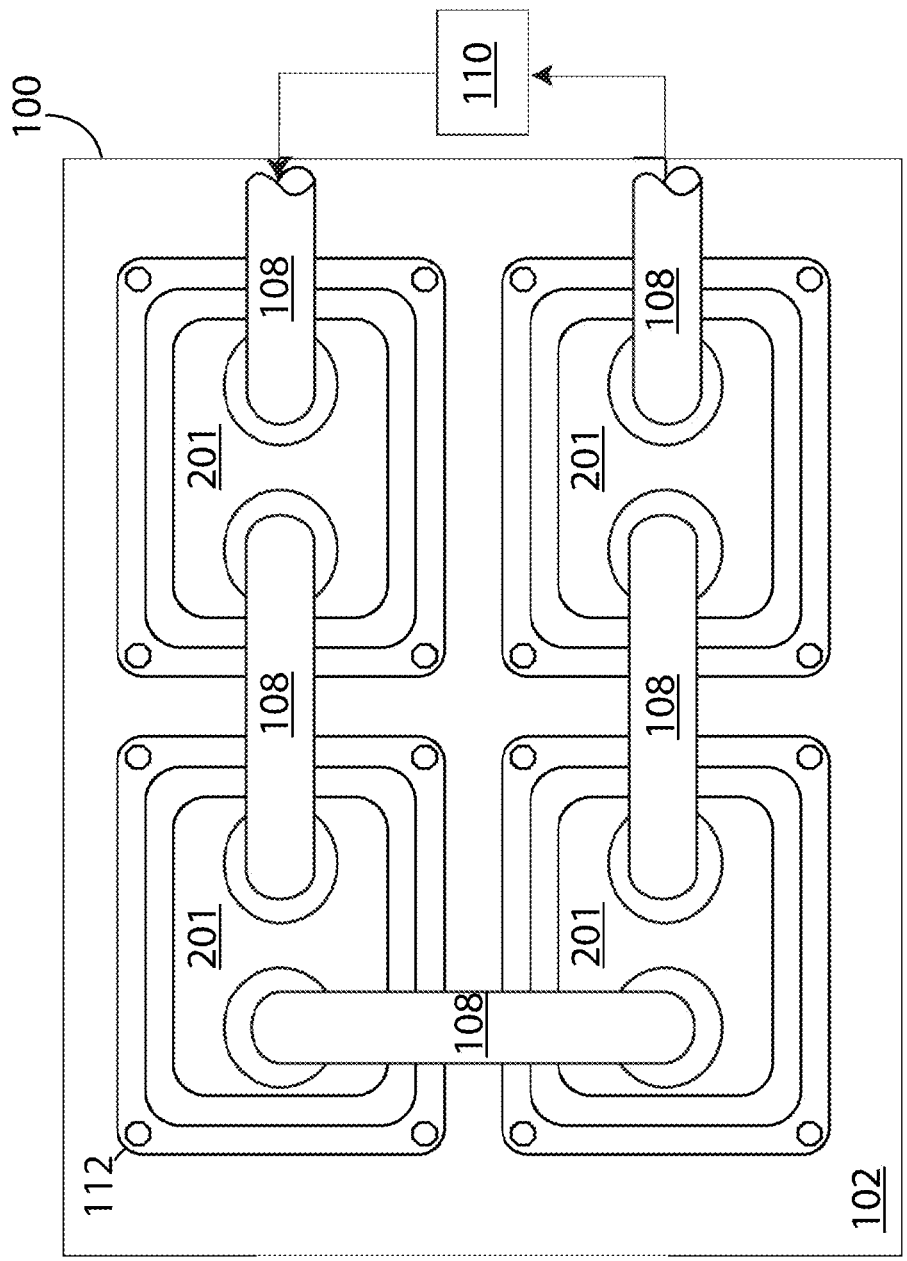
FIG. 2A is a schematic plan view of an example of a system panel, in accordance with embodiments of the present disclosure.

FIG. 2A is a schematic plan view of an example of a system panel 100, in accordance with embodiments of the present disclosure. Generally, the system panel 100 includes a printed circuit board (PCB) 102, a plurality of device packages 201 mounted to the PCB 102, and a plurality of coolant lines 108 fluidly coupling each of the device packages 201 to a coolant source 110. It is contemplated that coolant fluid may be delivered to each of the device packages 201 in any desired fluid phase, e.g., liquid, vapor, gas, or combinations thereof, and may flow out from each device package 201 in the same phase or a different phase. In some embodiments, the coolant fluid is delivered to the device packages 201 and returned therefrom as a liquid, whereby the coolant source 110 may comprise a heat exchanger or chiller to maintain the coolant fluid at a desired temperature. In other embodiments, the coolant fluid may be delivered to the device packages 201 as a liquid, vaporized to a vapor within the device packages 201, and returned to the coolant source 110 as a vapor. In those embodiments, the device packages 201 may be fluidly coupled to the coolant source 110 in parallel, and the coolant source 110 may include or further include a compressor (not shown) for condensing the received vapor to a liquid form.

Figure 2B:
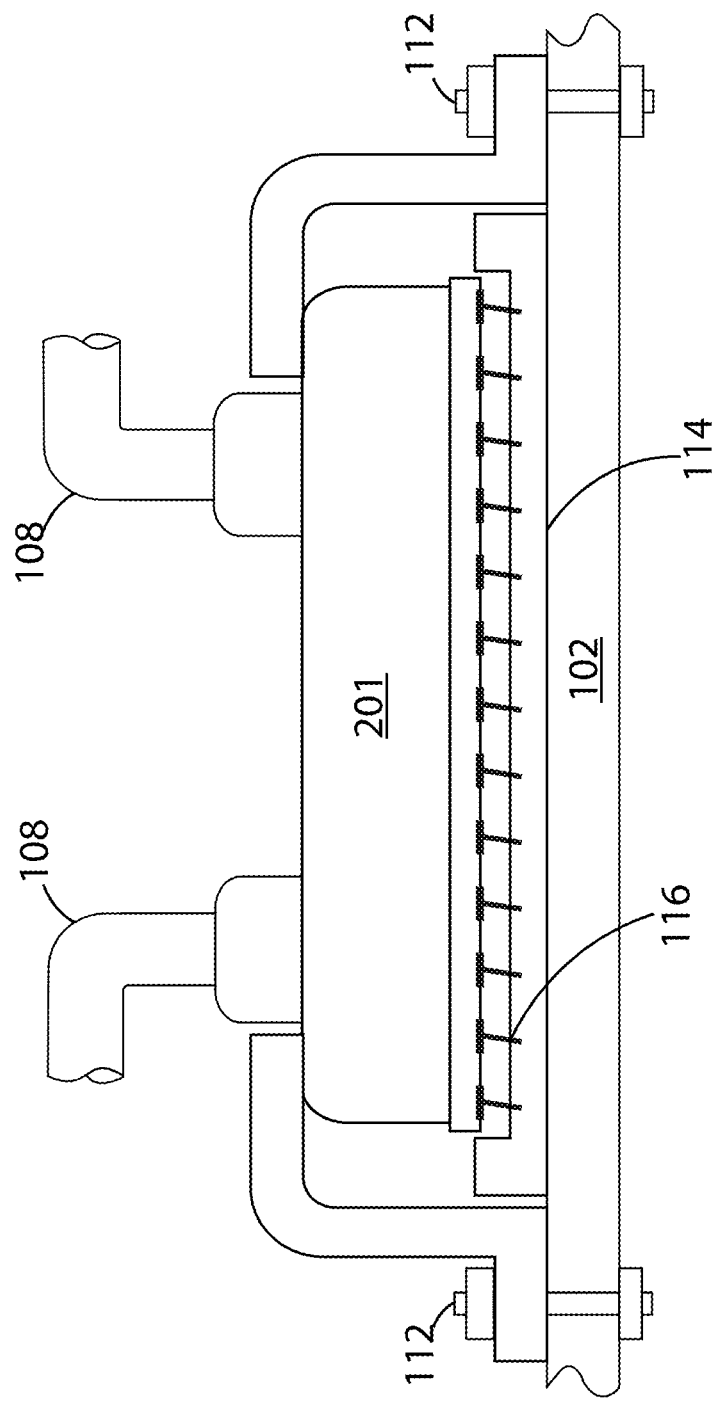
FIG. 2B is a schematic partial sectional side view of a device package mounted on a PCB, in accordance with embodiments of the present disclosure.

FIG. 2B is a schematic partial sectional side view of a portion of the system panel 100 of FIG. 2A. As shown, each device package 201 is fluidly coupled to the plurality of coolant lines 108 and is disposed in a socket 114 of the PCB 102 and connected thereto using a plurality of pins 116, or by other suitable connection methods, such as solder bumps (not shown). The device package 201 may be seated in the socket 114 and secured to the PCB 102 using a mounting frame and a plurality of fasteners 112, e.g., compression screws, collectively configured to exert a relatively uniform downward force on the upward facing edges of the device package 201. The uniform downward force ensures proper pin contact between the device package 201 and the socket 114.

Figure 2C:
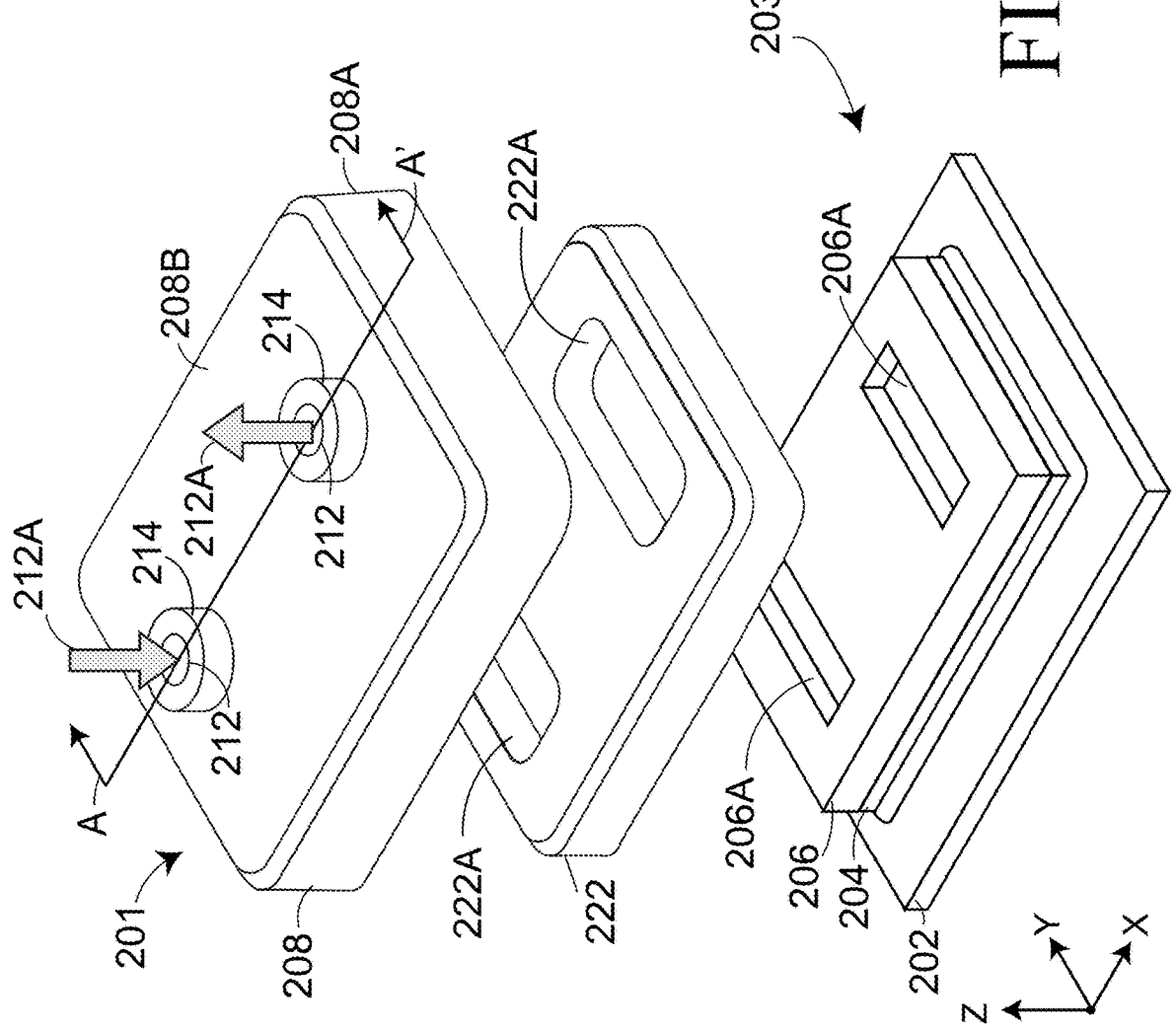
FIG. 2C is a schematic exploded isometric view of the device package in FIG. 2B.

FIG. 2C is a schematic exploded isometric view of an example device package 201, in accordance with embodiments of the present disclosure. Generally, the device package 201 includes a package substrate 202, an integrated cooling assembly 203 disposed on the package substrate 202, and a package cover 208 disposed on a peripheral portion of the package substrate 202. Suitable materials that may be used in the package cover 208 include copper, aluminum, metal alloys, etc. The package cover 208 extends over the integrated cooling assembly 203 so that the integrated cooling assembly 203 is disposed between the package substrate 202 and the package cover 208. The integrated cooling assembly 203 typically includes a semiconductor device 204 and a cold plate 206 bonded to the semiconductor device 204. In some embodiments, the cold plate 206 may comprise substrate material like silicon, glass, ceramic, etc. Although the lateral dimensions (or footprint) of the cold plate 206 are shown to be the same or similar to the lateral dimensions (or footprint) of the semiconductor device 204, the footprint of the cold plate 206 may be smaller or larger in one or both directions when compared to the footprint of the semiconductor device 204.

As shown, the device package 201 further includes a sealing material layer 222 that forms a coolant fluid impermeable barrier between the package cover 208 and the integrated cooling assembly 203 that prevents leaking of the coolant fluid outside of the cooling assembly and prevents coolant fluid from reaching an active side 218 (discussed below in relation to FIG. 2D) of the semiconductor device 204 and causing damage thereto. In some embodiments, the sealing material layer 222 comprises an adhesive material that reliably attaches the package cover 208 to the integrated cooling assembly 203. In some embodiments, the sealing material layer 222 comprises a polymer or epoxy material that extends upwardly from the package substrate 202 to encapsulate and/or surround at least a portion of the semiconductor device 204. In some embodiments, the sealing material layer 222 may also comprise conductive material, e.g., solder. In other embodiments, the sealing material layer 222 is formed from a molding compound, e.g., a thermoset resin, that when polymerized, forms a hermetic seal between the package cover 208 and the cold plate 206. Here, the coolant fluid is delivered to the cold plate 206 through openings 222A disposed through the sealing material layer 222. As shown, the openings 222A are respectively in registration and fluid communication with inlet and outlet openings 212 of the package cover 208 thereabove and inlet and outlet openings 206A in the cold plate 206 therebelow.

It will be understood that the openings are shown in a section view. The openings may have any cross-sectional shape that allows fluid to flow therethrough (e.g., rectangular, square, hexagonal or circular cross-sections). For example, the inlet and outlet openings 206A of the cold plate 206 may form an elongated shape extending from one side of the cold plate 206 to another side of the cold plate 206. For example, the inlet and outlet openings 206A may form any shape having a length greater than a width in the X-Y plane (e.g., a rectangular or a trapezoidal shape). A shape in the X-Y plane of the openings 222A disposed through the sealing material layer 222 may be substantially the same as the shape of the inlet and outlet openings 206A of the cold plate 206 in the same place. Furthermore, it will be understood that all references to an opening throughout the present disclosure refer to an opening defined by a sidewall (e.g., opening sidewall).

Generally, the package substrate 202 includes a rigid material, such as an epoxy or resin-based laminate, that supports the integrated cooling assembly 203 and the package cover 208. The package substrate 202 may include conductive features disposed in or on the rigid material that electrically couples the integrated cooling assembly 203 to a system panel, such as the PCB 102.

Figure 2D:
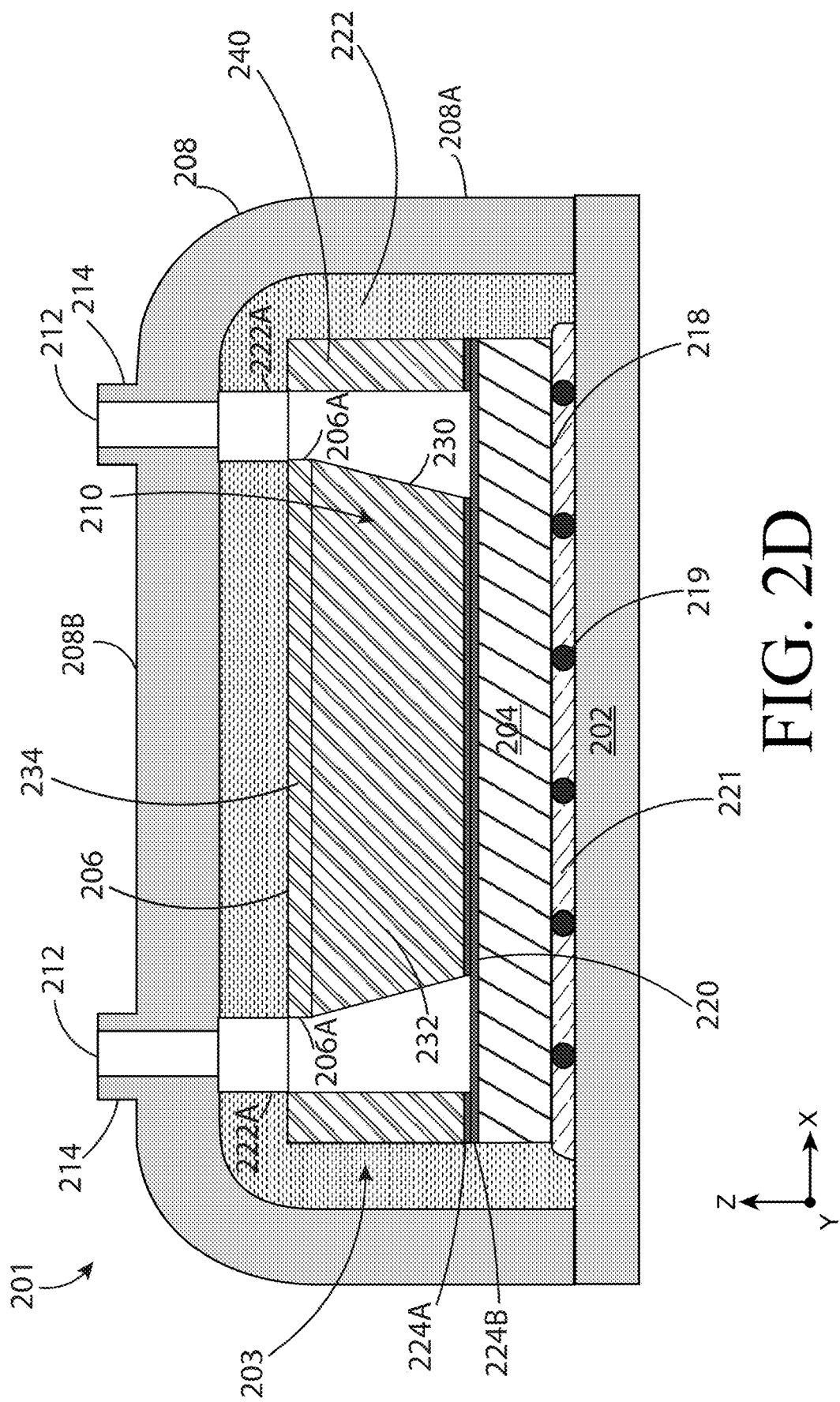
FIG. 2D is a schematic sectional view of an example device package, in accordance with embodiments of the present disclosure, that may be used with the system panel.

FIG. 2D is a schematic sectional view in the X-Z plane of the device package 201 taken along line A-A' of FIG. 2C. As illustrated in FIG. 2D, the semiconductor device 204 includes the active side 218 that includes device components, e.g., transistors, resistors, and capacitors, formed thereon or therein, and a non-active side, here the semiconductor device backside 220, opposite the active side 218. As shown, the active side 218 is positioned adjacent to and facing towards the package substrate 202. The active side 218 may be electrically connected to the package substrate 202 by use of conductive bumps 219, which are encapsulated by a first underfill layer 221 disposed between the semiconductor device 204 and the package substrate 202. The first underfill layer 221 may comprise a cured polymer resin or epoxy, which provides mechanical support to the conductive bumps 219 and protects against thermal fatigue. In some embodiments, the active side 218 may be electrically connected to another package substrate, another active die, or another passive die (e.g., interposer) using hybrid bonding or conductive bumps 219. The cold plate 206 may be disposed above the package substrate 202 with the semiconductor device 204 disposed therebetween. For example, the semiconductor device 204 (and the first underfill layer 221) may be disposed between the cold plate 206 and the package substrate 202. In some embodiments, the cold plate 206 may be disposed directly on the package substrate 202.

Here, the cold plate 206 comprises a top portion 234 and a sidewall 240 (e.g., a perimeter sidewall defining a perimeter of the cold plate 206) extending downwardly from the top portion 234 to the backside 220 of the semiconductor device 204. The top portion 234, the perimeter sidewall 240, and the backside 220 of the semiconductor device 204 collectively define a coolant channel 210 therebetween. The cold plate 206 comprises cavity dividers 230 extending downwardly from the top portion 234 towards the backside 220 of the semiconductor device 204. The cavity dividers 230 may extends laterally and in parallel between an inlet opening 206A of the cold plate 206 and an outlet opening 206A of the cold plate 206 to define coolant channels 210 therebetween. The inlet opening 206A and the outlet opening 206A may generally correspond to the at least two openings and separate apertures described later herein. It should be appreciated that, the cold plate 206 may comprise one cavity divider 230 which forms two coolant channels (e.g., one coolant channel on either side of the cavity divider 230) by means of the cavity divider 230 and portions of the perimeter sidewall 240. More specifically, coolant channels 210 may be formed between the cavity divider 230 and a portion of the perimeter sidewall 240 extending parallel to the cavity divider 230.

Figure 2E:
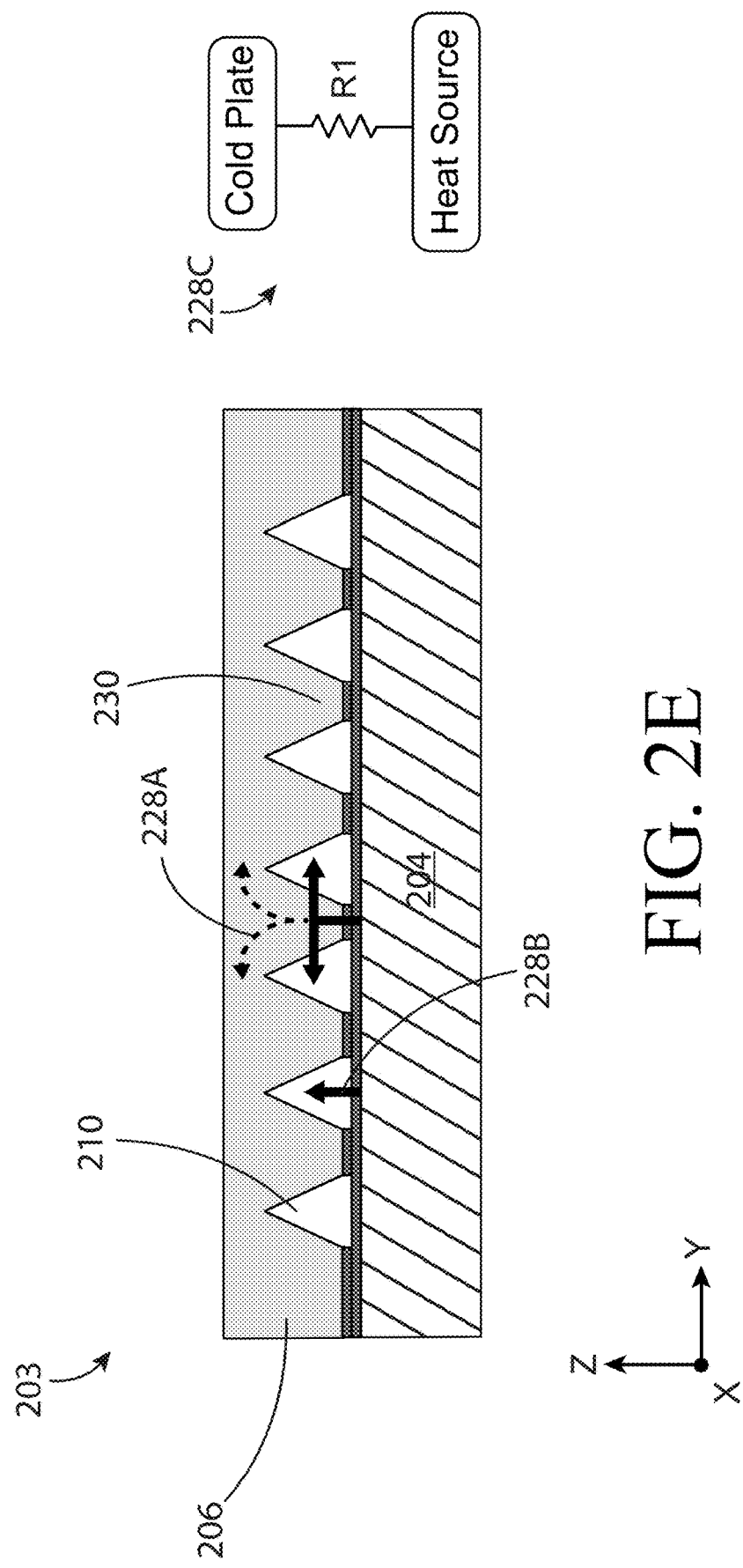
FIG. 2E is a schematic sectional view of an integrated cooling assembly of the device package, in accordance with embodiments of the present disclosure.
Figure 4:
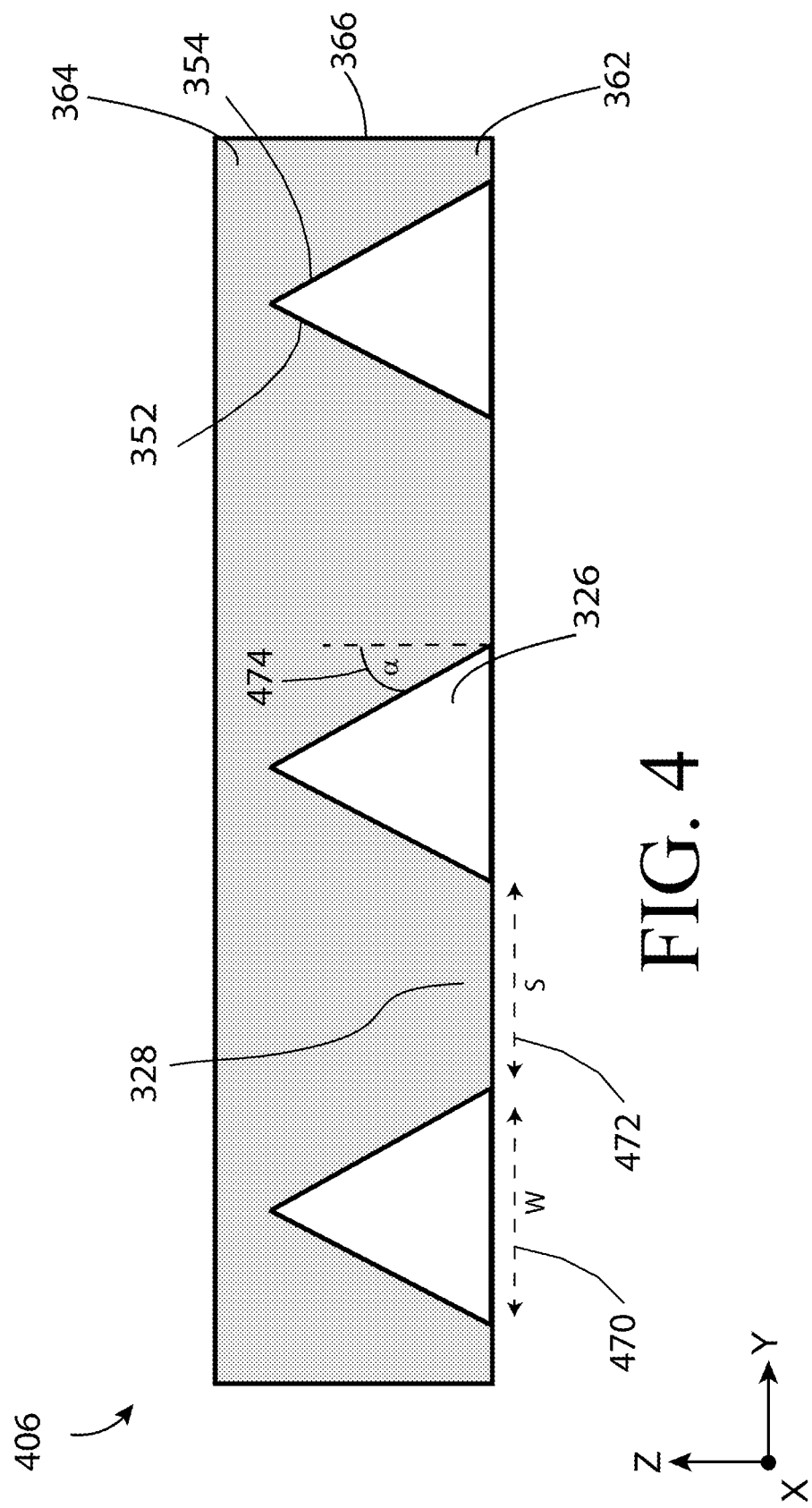
FIG. 4 is a partial schematic view of a cold plate in accordance with one or more embodiments.

Alternatively, in other embodiments, the cold plate 206 may comprise plural cavity dividers 230, for example two cavity dividers (as illustrated in FIG. 4), five cavity dividers, or six cavity dividers (as illustrated in FIG. 2E). In such examples, the cold plate 206 comprises more than two coolant channels 210, for example three coolant channels, four coolant channels, seven coolant channels, or more, defined between the cavity dividers 230 and/or the cavity divider(s) 230 and the perimeter sidewall 240.

The cavity dividers 230 comprise cavity sidewalls 232 which form surfaces of corresponding coolant channels 210. In embodiments where plural cavity dividers 230 extend in parallel to each other, cavity sidewalls 232 of adjacent cavity dividers 230 are opposite (e.g., facing) each other. In embodiments comprising a single cavity divider 230, a first cavity sidewall may be opposite (e.g., face) a first portion of the perimeter sidewall 240 extending parallel to and facing the first cavity sidewall. A second cavity sidewall may be opposite (e.g., face) a second portion of the perimeter sidewall 240 extending parallel to and facing the second cavity sidewall. The first portion of the perimeter sidewall 240 may be an opposite side of the cold plate 206 to the second portion of the perimeter sidewall 240. For example, in embodiments where the cold plate 206 is rectangular, first and second opposing sides of the rectangular cold plate 206 form the first and second portions of the perimeter sidewall 240.

The cavity dividers 230 may be continuous cavity dividers which extend continuously (e.g., in the Y-axis direction) between the inlet opening 206A and the outlet opening 206A of the cold plate 206.

With reference to FIG. 2D, coolant channels 210 may be defined by:
- the backside 220 of the semiconductor device 204, which forms lower coolant channel surfaces;
- portions of the perimeter sidewall 240 extending in the Y-axis direction, which form end surfaces of the coolant channels 210;
- the cavity sidewalls 232, which form inner surfaces of the coolant channels 210 in the X-axis direction; and
- portions of the perimeter sidewall 240 extending in the X-axis direction, which form outer surfaces of the coolant channels 210 in the X-axis direction.

Here, the cavity sidewalls 232 are formed at an acute angle with respect to the backside 220 of the semiconductor device 204 such that upper portions of opposing (e.g., facing) cavity sidewalls 232 meet. Therefore, the cavity sidewalls 232 and the backside 220 of the semiconductor device 204 collectively define a triangular cross-section of the coolant channel 210.

In some embodiments, the backside 220 of the semiconductor device 204 comprises a corrosion protective layer (not shown). The corrosion protective layer may be a continuous layer disposed across the entire backside 220 of the semiconductor device 204, such that the cold plate 206 is attached thereto. Beneficially, the corrosion protective layer provides a corrosion-resistant barrier layer, thus preventing undesired corrosion of the semiconductor device 204 (e.g., the semiconductor substrate material which might otherwise be in direct contact with coolant fluid flowing through a coolant chamber volume 210).

One or more coolant chamber volumes may include one or more coolant channels. The coolant channels may extend between a single inlet opening and a single outlet opening of the cold plate 206, such that the coolant chamber volume(s) and/or coolant channel(s) share the same inlet and outlet openings. In some embodiments, multiple inlet and/or outlet openings may be coupled to the coolant chamber volume(s).

In embodiments having plural coolant chamber volumes and/or plural coolant channels, each coolant chamber volume and/or coolant channel may be connected between a separate inlet opening and a separate outlet opening. In such embodiments, the coolant fluid may be directed to the separate inlet openings and from the separate outlet openings using a manifold disposed above the openings in the Z-axis direction.

In some embodiments, the one or more coolant channels 210 have a triangular cross-section, shown in more detail in FIGS. 3A, 3B, and 4 below. In some embodiments, the width (in the Y-axis) of the one or more coolant chamber channels 210 is approximately equal to the width of the spacing (in the Y-axis direction) between the one or more coolant chamber volumes 210. In some embodiments there are an odd number of coolant channels 210 formed in the cold plate 206. In some embodiments there are an even number of coolant channels 210 formed in the cold plate 206.

In some embodiments, a height in the Z-axis direction of the coolant chamber volume(s) and or coolant channel(s) may be greater than 100 µm, 100 µm-1000 µm, or 100 µm-700 µm. A width in the Y-axis direction of the coolant chamber volume(s) and/or coolant channel(s) may be greater than 100 µm, 100 µm-1000 µm, or 100 µm-700 µm. For example, the width of the coolant chamber volume(s) and/or coolant channel(s) may be greater than the height. The width of the coolant chamber channels 210 may, at its widest portion, which may be taken as the base of the triangular shape of the coolant chamber channels 210 shown in FIG. 2E and FIGS. 3A, 3B, and 4, range from 0.2 mm to 5 mm.

More specifically, the width of the coolant chamber channels 210 may range from 0.5 to 1.5 mm. The width of the coolant chamber channels 210 may also be between 1 and 5 mm.

A cross-section of the coolant chamber volume(s) and/or coolant channel(s) in the Y-Z plane is wide enough to allow for a pressure drop of 0-20 psi, 3-15 psi, or 4-10 psi.

In some embodiments, preparing a desired surface roughness of the sidewalls of the coolant chamber volume(s) and/or coolant channels may include depositing an organic layer on a photoresist layer after cold plate features have been etched to form a micro-masking layer, such as between 1 to 30 nm. The micro-masking layer may be dry etched to form the desired surface roughness, such as between 0.1 to 3.0 nm.

With reference to FIG. 2D, the cold plate 206 is attached to the backside 220 of the device 204 without the use of an intervening adhesive. For example, the cold plate 206 may be directly bonded to the backside 220 of the device 204, such that the cold plate 206 and the backside 220 of the device 204 are in direct contact. For example, in some embodiments, one or both of the cold plate 206 and the backside 220 of the semiconductor device 204 may comprise a dielectric material layer, e.g., a first dielectric material layer 224A and a second dielectric material layer 224B respectively, and the cold plate 206 is directly bonded to the backside 220 of the semiconductor device 204 through bonds formed between the dielectric material layers 224A, 224B. In some embodiments, one of the cold plate 206 or the backside 220 of the semiconductor device 204 may comprise a thin bonding dielectric layer (e.g., silicon nitride, etc.) and other element(s) may not include any such explicit bonding dielectric layer (or can have only a native oxide layer). The first and second dielectric material layers 224A, 224B may be continuous or non-continuous. For example, the first dielectric material layer 224A may be disposed only on lower surfaces of the cold plate 206 facing the backside 220 of the semiconductor device 204. With reference to FIG. 4, described below, portions of the first dielectric material layer 224A may be disposed only on lower surfaces of support features 230 and the perimeter sidewall 240. Beneficially, directly bonding the cold plate 206 to the semiconductor device 204, as described above, reduces the thermal resistance therebetween and increases the efficiency of heat transfer from the semiconductor device 204 to the cold plate 206. In particular, thermal resistance is reduced by directly bonding lower surfaces of the cavity dividers 230 facing the semiconductor device 204 to the backside 220 of the semiconductor device 204.

FIG. 2E is a schematic sectional view in the Y-Z plane of the integrated cooling assembly 203. In FIG. 2E, the cold plate 206 comprises a patterned side that faces towards the semiconductor device 204 and an opposite side that faces towards the package cover 208 (not shown). The patterned side comprises a coolant chamber volume having plural coolant channels 210, which extend laterally between the inlet and outlet openings of the cold plate 206. Each coolant channel 210 comprises cavity sidewalls that define a corresponding coolant channel 210. Portions of the cold plate 206 between the cavity sidewalls form support features 230. The support features 230 provide structural support to the integrated cooling assembly 203 and disrupt laminar fluid flow at the interface of the coolant and the device backside 220, resulting in increased heat transfer therebetween. Furthermore, by introducing plural coolant channels 210 to define separate coolant flow paths, an internal surface area of the cold plate 206 is increased, which further increases the efficiency of heat transfer.

In FIG. 2E, arrows 228A and 228B illustrate two different heat transfer paths in the integrated cooling assembly 203. A first heat transfer path illustrated by arrow 228B shows heat generated by the semiconductor device 204 transferring directly from the semiconductor material of the semiconductor device 204 to coolant fluid flowing through the cold plate 206. A second heat transfer path illustrated by arrows 228A shows heat generated by the semiconductor device 204 being transferred from semiconductor material (e.g., silicon material) of the semiconductor device 204 to semiconductor material (e.g., silicon material) of the cold plate 206 structure, propagated throughout the semiconductor material of the cold plate 206 structure (shown as dashed lines), and being transferring into coolant fluid flowing through the cold plate 206. A thermal resistance of the first and second heat transfer paths 228A, 228B is illustrated by heat transfer path 228C, which is shown as thermal resistance R1 between a heat source and a cold plate. Here, R1 is the thermal resistance of the bulk semiconductor material of the semiconductor device 204. It can be seen that the heat transfer path 228C of the integrated cooling assembly 203 is reduced compared to the heat transfer path 26 of the device package 10 of FIG. 1, due to the direct bonding discussed above.

In some embodiments, the cold plate 206 may be attached to the semiconductor device 204 using a hybrid bonding technique, where bonds are formed between the dielectric material layers 224A, 224B (see FIG. 2D) and between metal features, such as between first metal pads and second metal pads, disposed in the dielectric material layers 224A, 224B.

Suitable dielectrics that may be used as the dielectric material layers 224A, 224B include silicon oxides, silicon nitrides, silicon oxynitrides, silicon carbon nitrides, metal-oxides, metal-nitrides, silicon carbide, silicon oxycarbides, silicon oxycarbonitride, diamond-like carbon (DLC), or combinations thereof. In some embodiments, one or both of the dielectric material layers 224A, 224B are formed of an inorganic dielectric material, e.g., a dielectric material substantially free of organic polymers. Typically, one or both of the dielectric layers are deposited to a thickness greater than the thickness of a native oxide, such as about 1 nanometer (nm) or more, 5 nm or more, 10 nm or more, 50 nm or more, or 100 nm or more. In some embodiments, one or both of the layers are deposited to a thickness of 3 micrometers or less, 1 micrometer or less, 500 nm or less, such as 100 nm or less, or 50 nm or less. The dielectric layer material and thickness may be optimized for lower thermal resistance between the die and the cold plate.

The cold plate 206 may be formed of any suitable material that has sufficient structural strength to withstand the desired pressures of coolant flowing into the coolant chamber volume 210. For example, the cold plate 206 may be formed of semiconductor material like silicon or other engineered materials like glass. In other examples, the cold plate 206 may be formed of a material selected from a group comprising polymers, metals, ceramics, or composites thereof. In some embodiments, the cold plate 206 may be formed of stainless steel (e.g., from a stainless steel metal sheet) or a sapphire plate.

In some embodiments, the cold plate 206 may be formed of a bulk material having a substantially similar coefficient of linear thermal expansion (CTE) to the bulk material of the substrate 202 and/or the semiconductor device 204, where the CTE is a fractional change in length of the material (in the X-Y plane) per degree of temperature change. In some embodiments, the CTEs of the cold plate 206, the substrate 202, and/or the semiconductor device 204 are matched so that the CTE of the substrate 204 and/or the semiconductor device 204 is within about +/−20% or less of the CTE of the cold plate 206, such as within +/−15% or less, within +/−10% or less, or within about +/−5% or less when measured across a desired temperature range. In some embodiments, the CTEs are matched across a temperature range from about −60° C. to about 100° C. or from about −60° C. to about 175° C. In one example embodiment, the matched CTE materials each include silicon.

In some embodiments, the cold plate 206 may be formed of a material having a substantially different CTE from the semiconductor device 204, e.g., a CTE mismatched material. In such embodiments, the cold plate 206 may be attached to the semiconductor device 204 by a compliant adhesive layer (not shown) or a molding material that absorbs the difference in expansion between the cold plate 206 and the semiconductor device 204 across repeated thermal cycles.

The package cover 208 shown in FIGS. 2C and 2D generally comprises one or more vertical or sloped sidewall portions 208A and a lateral portion 208B that spans and connects the sidewall portions 208A. The sidewall portions 208A may extend upwardly from a peripheral surface of the package substrate 202 to surround the device 204 and the cold plate 206 disposed thereon. The lateral portion 208B may be disposed over the cold plate 206 and is typically spaced apart from the cold plate 206 by a gap corresponding to the thickness of the sealing material layer 222. The sealing material layer 222 may be formed of a gasket, may be formed of an o-ring, or may comprise an adhesive.

Coolant is circulated through the coolant chamber volume 210 through the inlet and outlet openings 212 of the package cover 208 formed through the lateral portion 208B. The inlet and outlet openings 206A of the cold plate 206 may be in fluid communication with the inlet and outlet openings 212 of the package cover 208 through the inlet and outlet openings 222A formed in the sealing material layer 222 disposed therebetween. In certain embodiments, coolant lines 108 (FIGS. 2A-2B) may be attached to the device package 201 by use of connector features formed in the package cover 208, such as threads formed in the sidewalls of the inlet and outlet openings 212 of the package cover 208 and/or protruding features 214 that surround the inlet and outlet openings 212 and extend upwardly from a surface of the lateral portion 208B.

Typically, the package cover 208 is formed of semi-rigid or rigid material so that at least a portion of the downward force exerted on the package cover 208 by the mounting frame is transferred to a supporting surface of the package substrate 202 and not transferred to the cold plate 206 and the semiconductor device 204 therebelow. In some embodiments, the package cover 208 is formed of a thermally conductive metal, such as aluminum or copper. In such embodiments, the package cover 208 functions as a heat spreader that redistributes heat from one or more electronic components of the semiconductor device 204. In some embodiments, the package cover 208 may consist of a thermally insulating material or materials. In such embodiments, the package cover 208 functions as a thermal insulator to retain heat or cold.

It should be noted that the direction in which the coolant fluid flows through the cold plate 206 may be controlled depending on the relative locations of the inlet and outlet openings. For example, the coolant fluid may flow from left to right in the device package 201 of FIG. 2D when the inlet openings 212, 222A, 206A of the package cover 208, the sealing material layer 222, and the cold plate 206, respectively, are located on the left-hand side of the device package 201 and the outlet openings 212, 222A, 206A of the package cover 208, the sealing material layer 222, and the cold plate 206, respectively, are located on the right-hand side of the device package 201. Alternatively, the coolant fluid may flow from right to left in the device package 201 illustrated in FIG. 2D when the outlet openings 212, 222A, 206A of the package cover 208, the sealing material layer 222, and the cold plate 206 are located on the left-hand side of the device package 201 and the inlet openings 212, 222A, 206A of the package cover 208, the sealing material layer 222, and the cold plate 206 are located on the right-hand side of the device package 201. Although only one set of inlet and outlet openings is shown and described here, additional inlet and outlet openings may also be provided at various locations on the package cover 208, the sealing material layer 222, and the cold plate 206.

An example flow path of the coolant fluid through the coolant chamber volume 210 may be as follows:
1. Coolant fluid enters the coolant chamber volume 210 through the inlet openings.
2. Coolant fluid flows across the inside surfaces of the cold plate 206 and absorbs heat generated by the semiconductor device 204, which has dissipated into the cold plate 206 structure. The coolant fluid may also flow directly across the backside 220 of the semiconductor device 204 to absorb heat energy directly from the semiconductor device 204. The coolant chamber volume 210 may additionally have various channels formed to direct the coolant fluid flow from inlet opening(s) to outlet opening(s) and facilitate heat extraction from the semiconductor device 204 by the coolant fluid. In some embodiments, the coolant fluid may be in direct contact with the backside 220 of the semiconductor device 204 or via one or more substrate or layers between the coolant fluid or backside 220 of the semiconductor device 204.
3. Coolant fluid exits the coolant chamber volume 210 through outlet openings.

It will be understood from the above flow path that heat is extracted without introducing an unnecessary thermal resistance (e.g., a TIM disposed between the backside 220 of the semiconductor device 204 and the cold plate 206) between the backside 220 of the semiconductor device 204 and the cold plate 206.

Figure 2F:
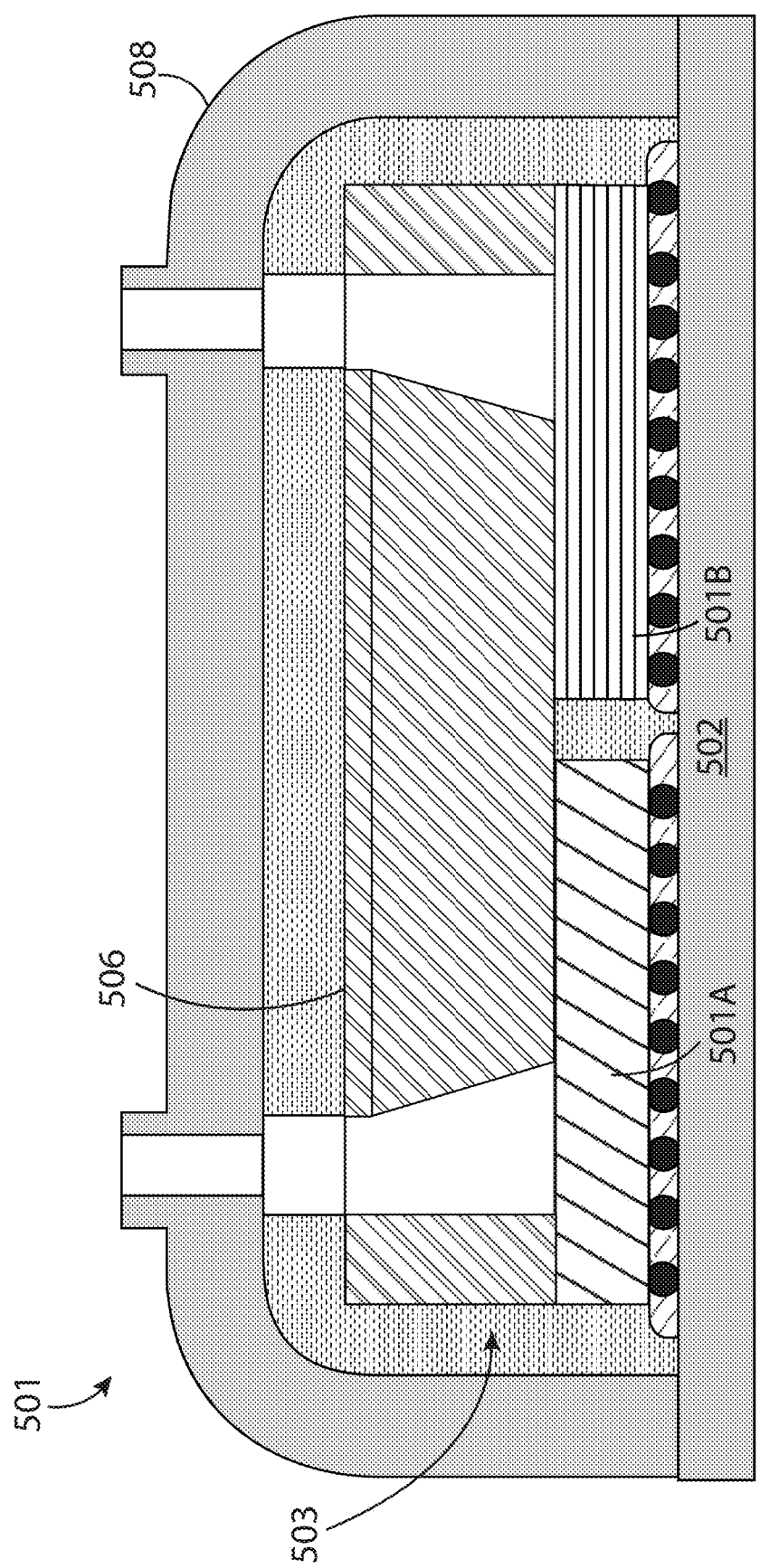
FIG. 2F is a schematic sectional view of another example device package, in accordance with embodiments of the present disclosure, that may be used with the system panel.

FIG. 2F is a schematic side sectional view in the X-Z plane of an example of a multi-component device package 501 that includes a cold plate 506 directly bonded to the backside surfaces of two or more devices 501A, 501B. The multi-component device package 501 may be similar to the device package 201 described above, and therefore the description of similar features is omitted for brevity. In some embodiments, the two or more devices 501A and 501B are reconstituted and then bonded to the cold plate 506. As shown, the device package 501 includes a package substrate 502, an integrated cooling assembly 503 and a package cover 508. The integrated cooling assembly 503 may include a plurality of devices 501A (one shown) that may be singulated and/or disposed in a vertical device stack 501B (one shown). The cold plate 506 may be attached to each of the devices 501A and device stack 501B, e.g., by the direct bonding methods described herein or other methods including flip chip bonding, etc. In some embodiments, the device 501A may comprise a processor, and the device stack 501B may comprise a plurality of memory devices. Here, the device 501A and the device stack 501B are disposed in a side-by-side arrangement on the package substrate 502 and are in electrical communication with one another through conductive elements formed in, on, or through the package substrate 502. Here, the cold plate 506 is sized to provide a bonding surface for attachment to both the device 501A and the device stack 501B but may otherwise be the same or substantially similar to other cold plates described herein. In some embodiments, the lateral dimensions (or footprint) of the cold plate 506 may be smaller or larger than the combined lateral dimensions (or footprint) of both the device 501A and the device stack 501B. In some embodiments, one or more sidewalls of the cold plate 506 may be aligned or offset to the vertical sidewalls of the device 501A and the device stack 501B (including inside or outside their footprint). In some embodiments, more than one cold plate 506 may be bonded. For example, separate cold plates may be bonded to the device 501A and the device stack 501B.

Figure 3A:
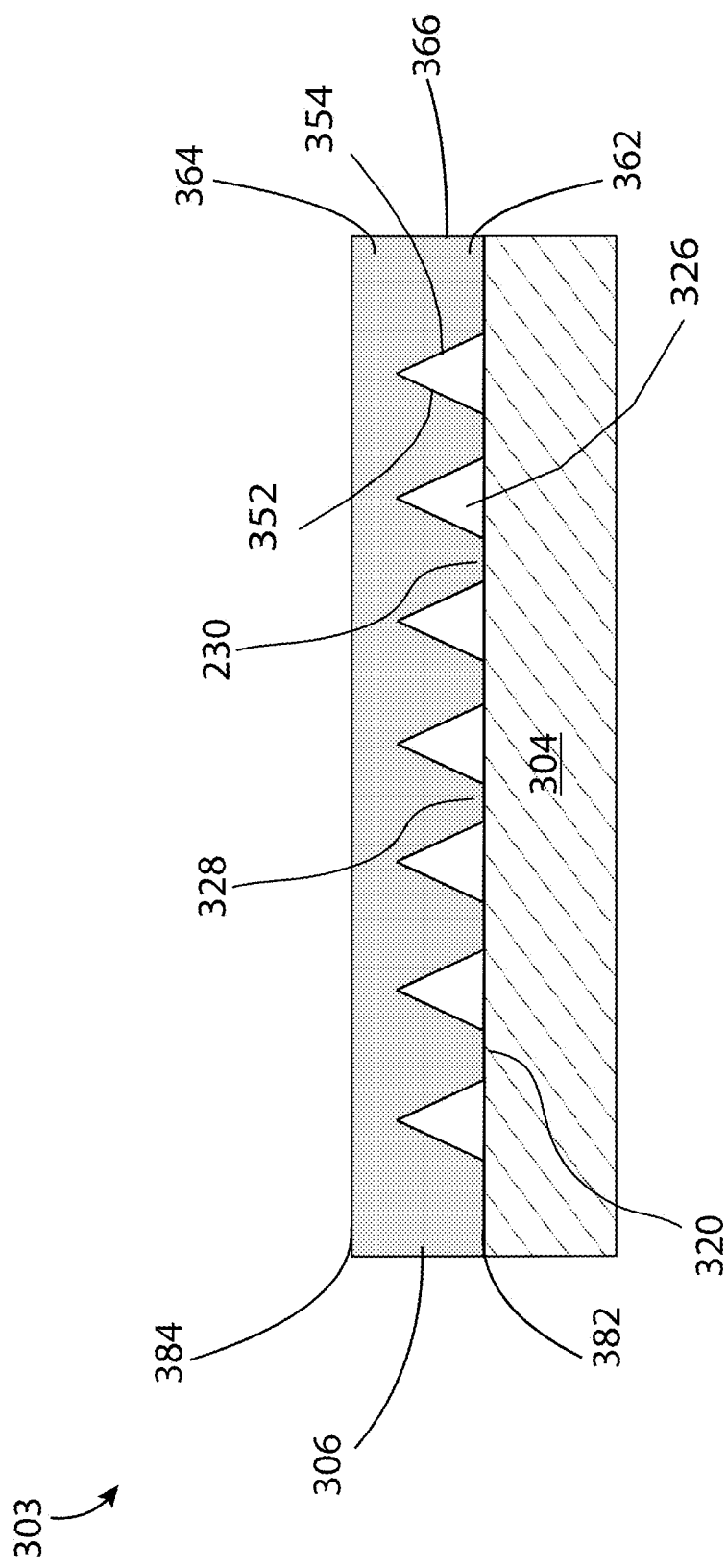
FIG. 3A is schematic of a cooling assembly having a cold plate and a semiconductor device, in accordance with one or more embodiments.

FIG. 3A is a schematic sectional view in the Y-Z plane of an example integrated cooling assembly 303, in accordance with embodiments of the disclosure, which may be used as part of the device package 201 of FIG. 2D, comprising a coolant chamber 326 design having triangular cross-sections. The integrated cooling assembly 303 comprises a cold plate 306 and a semiconductor device 304. Here, the semiconductor device 304 is bonded to the cold plate 306. As described above, the semiconductor device 304 may include an active side that includes device components (e.g., transistors, resistors, capacitors, etc.) formed thereon or therein, and a non-active side (e.g., the device backside) opposite the active side.

The cold plate 306 of the integrated cooling assembly 303 of FIG. 3A comprises a top portion 364 and a bottom portion 362 the top portion 364 being above the bottom portion 362 in the Z-axis, as shown in FIG. 3A. The bottom portion 362 of the cold plate 306 is the portion of the cold plate 306 which is bonded to the backside 320 of the semiconductor device 304. The cold plate 306 includes a sidewall 366 which defines the perimeter of the cold plate 306. The sidewall 366, in some embodiments, is the outer wall of the cold plate 306, and may be referred to as a perimeter sidewall 366 or perimeter 366.

In some embodiments, the top portion 364 of the cold plate 306 comprises first cavity sidewalls 352 and second cavity sidewalls 354 which extend toward the backside of the semiconductor device (and through the bottom portion 362 of the cold plate 306) at an angle with respect to the Z-axis direction to define a coolant chamber volume 326 therebetween. In some embodiments, the first cavity sidewalls 352 and second cavity sidewalls 354 form a pair of opposing cavity sidewalls. Such an arrangement is shown in FIG. 3A.

As can be seen in FIG. 3A, each coolant chamber volume 326 is defined by respective first cavity sidewalls 352 and second cavity sidewalls 354, which form pairs of opposing cavity sidewalls. The coolant chamber volumes 326 extend through the cold plate 306 in the X-axis direction and are spaced apart from each other along the cold plate 306 in the Y-axis. In the case of each coolant chamber volume 326, each first cavity sidewall 352 and second cavity sidewall 354 extends away from the top portion 364 of the cold plate 306 and through the bottom portion 362 of the cold plate 306 to the backside of the semiconductor device.

Between each of the coolant chamber volume 326 is a portion of the cold plate 306 which defines a divider 328 (e.g. a lower surface of the top portion 364). In some embodiments, the width of each divider 328 between adjacent cavity sidewalls 352, 354 and at the interface between the semiconductor device 304 and the cold plate 306 is approximately equal to the width of each coolant chamber volume 326. The cavity sidewalls 352, 354 slope such that they meet at a point as can be seen in FIG. 3A, and are spaced apart at the interface between the cold plate 306 and the semiconductor device 304 so as to form the triangular cross-section.

FIG. 3A shows a cold plate 306 attached to a semiconductor device 304. The cold plate 306 includes seven coolant chamber volumes 326 which extend laterally and in parallel between openings 360 (not shown) of the cold plate 306. In some embodiments, this number of coolant chamber volumes 326 may be fewer or greater than seven. As discussed above, each of the coolant chamber volumes 326 may extend laterally between a first and second openings 360, such that the coolant chamber volumes 326 share the same openings. In some cases, each coolant chamber volume may comprise a separate inlet opening and a separate outlet opening.

Figure 3B:
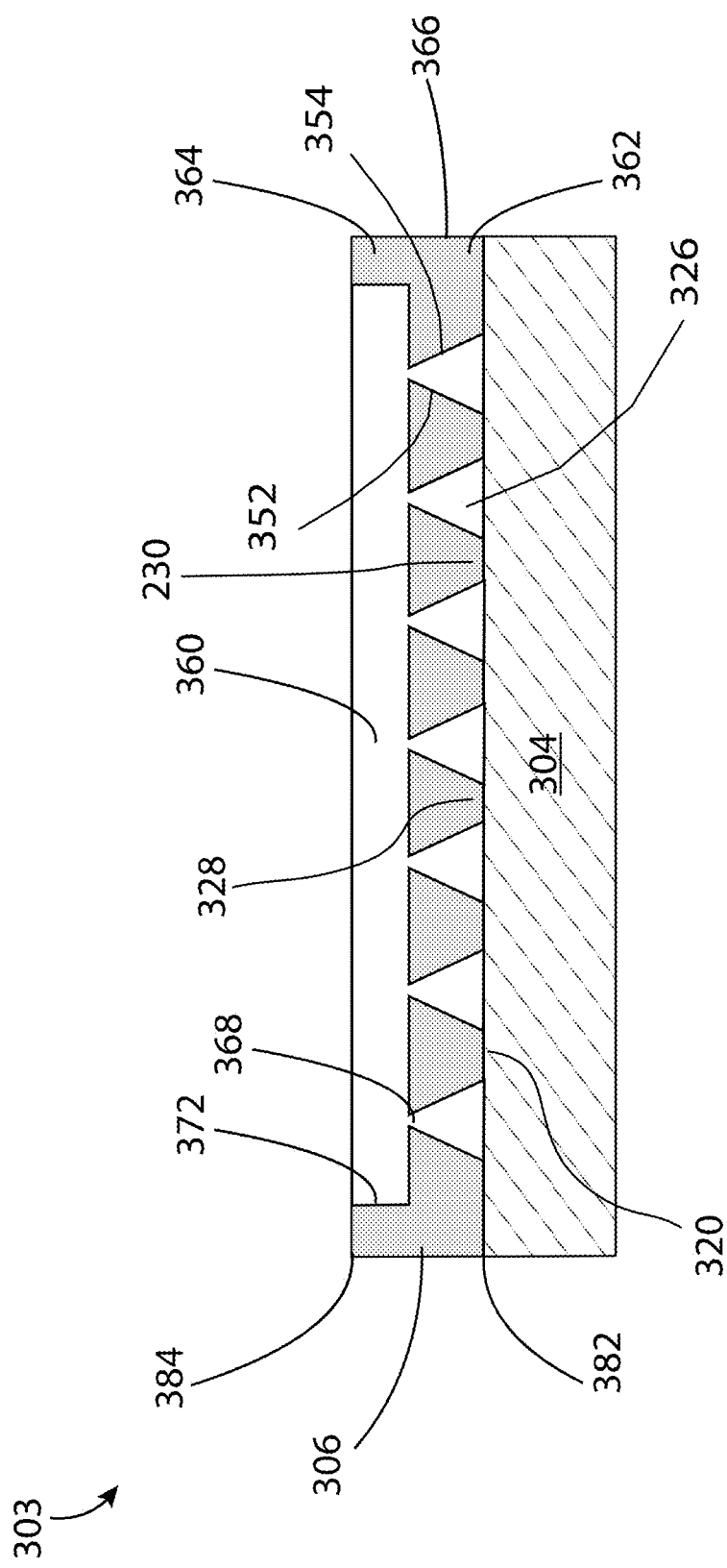
FIG. 3B is schematic of a cooling assembly having a cold plate and a semiconductor device, in accordance with one or more embodiments.

FIG. 3B is a schematic sectional view in the Y-Z plane of an example integrated cooling assembly 303, in accordance with embodiments of the disclosure. The sectional view of FIG. 3B is taken at a different point along the integrated cooling assembly 303 of that shown in FIG. 3A, and corresponds generally to the integrated cooling assembly 303 of FIG. 3A, and therefore description of like features will be omitted for brevity. As with that shown in FIG. 3A, the integrated cooling assembly 303 of FIG. 3B includes a cold plate 306 having seven coolant chamber volumes 326. The coolant chamber volumes 326 of the cold plate 306 are separated by cavity dividers 230. The cold plate 306 of FIG. 3B has a first side 382 and a second side 384, and a perimeter 366. FIG. 3B also shows an opening 360 in a second side 384 of the cold plate 306. The opening 360 may include opening sidewalls 372. As can be seen in FIG. 3B, the opening 360 is in fluid communication with the coolant chamber volumes 326. The opening 360 may be one of at least two openings 360 in the second side 384 of the cold plate 306. The opening 360 shown in FIG. 3B may be configured to allow the ingress of fluid into, or egress of fluid out of, the coolant chamber volumes 326 of the cold plate 306. As will be described later herein, each divider 328 may pass across the opening 360 such that each coolant chamber volumes 326 have a constant cross-sectional profile along substantially their entire lengths.

A constant, or uniform, cross-sectional area along the length of a coolant chamber volume may give rise to a more uniform liquid velocity in each coolant chamber volume 326. Expressed another way, coolant chamber volumes 326 which have a closed end may, in general, have a more constant velocity of fluid or liquid passing through the coolant chamber volume 326. This may in turn improve the cooling efficiency of each coolant chamber volume 326 and thus the overall cooling efficiency of a cold plate 306. The closed end geometry of coolant chamber volumes 326 has less open volume at each end thereof, which may give rise to a higher velocity of fluid flow within each coolant chamber volume 326.

Each coolant chamber volume 326 may have at least one separate aperture 368 which passes from the coolant chamber volume 326 into the opening 360, such that there is an opening or aperture in each coolant chamber volume 326 which passes all the way through the cold plate 306. This will be described in more detail with reference to FIGS. 5B and 5C below.

FIG. 4 is a schematic sectional view in the Y-Z plane of an example cold plate 406, in accordance with embodiments of the disclosure. FIG. 4 shows, a section of a cold plate 406 which corresponds generally to the cold plate 306 shown in FIGS. 3A and 3B, and therefore description of like features will be omitted for brevity. In FIG. 4, the coolant chamber width 470 of the coolant chamber volume 326 is denoted as W and the coolant chamber spacing 472, the spacing between the coolant chamber volumes 326, is denoted as S. In general, the cooling performance of the cold plate 406 is optimal when the coolant chamber width 470 is approximately equal to the coolant chamber spacing 472, such that the ratio of W to S is about 1 to 1. Such a ratio of coolant chamber width 470 to coolant chamber spacing 472 gives rise to relatively low thermal resistance whilst providing optimal thermal performance, such that the efficiency of heat dissipation from the semiconductor device 304 into the cold plate 306 and the coolant flowing therethrough is maximized.

In some examples, the ratio of W to S differs from about 1 to 1. In some examples, the coolant chamber spacing 472, denoted as S may be larger than the coolant chamber width 470, denoted as W. In some examples, S may be around 5% larger than W. In some examples, S may be around 10% larger than W. In some examples, S may be around 20% larger than W. In some examples, S may be around 50% larger than W. In some examples, S may be more than 50% larger than W.

In some examples, the coolant chamber spacing 472, denoted as S may be smaller than the coolant chamber width 470, denoted as W, such that the coolant chamber width 470 is greater than the coolant chamber spacing 472. In some examples, W may be around 5% larger than W. In some examples, W may be around 10% larger than S. In some examples, W may be around 20% larger than S. In some examples, W may be around 50% larger than S. In some examples, W may be more than 50% larger than S.

In some examples, the coolant chamber spacing 472 may differ across the cold plate 406, with the coolant chamber spacing 472 being different between each coolant chamber volume 326. In some examples, the coolant chamber width 470 may differ across the cold plate 406, with the coolant chamber width 470 varying for some or all of the coolant chamber volumes 326.

FIGS. 3A, 3B, and 4 all show coolant chamber volumes 326 having a triangular cross-section. The triangular cross-section of the coolant chamber volumes 326, defined by the cavity sidewalls 352, 354, may be formed by etching the top surface 362 of the cold plate 306 to form the cavity sidewalls 352, 354 which form each coolant chamber volume 326. The coolant chamber volumes 326 may in some examples take a trapezoid shape, such that the cavity sidewalls 352, 354 are spaced apart from one another and the coolant chamber volume 326 having a base. Coolant chamber volumes 326 having a triangular cross-section may present an advantage over coolant chamber volumes having a trapezoidal cross-section because an increased number of coolant chamber volumes 326 having triangular cross-sections may be accommodated in a cold plate 306 as compared to coolant chamber volumes having a trapezoidal cross-section.

For a cold plate having coolant chamber volumes 326 therein having a length L, more coolant chamber volumes 326 having a triangular cross-section than coolant chamber volumes having a trapezoidal cross-section may be accommodated. In some cases, the increased number of coolant chamber volumes 326 having a triangular cross-section is twice as many as coolant chamber volumes having a trapezoidal cross-section. The perimeter of the respective coolant chamber volumes 326 may be defined as the length of the cavity sidewall 352, 354 of the coolant channel which is closest to the semiconductor device 304.

More coolant chamber volumes 326 having a triangular cross-section gives rise to more length of sidewall. In turn, this gives rise to a greater perimeter of coolant chamber volumes 326, and therefore a greater surface area available for a cooling interface between a semiconductor device 304 and a coolant in the coolant chamber volumes 326. For example, a cold plate 306 having twenty coolant chamber volumes 326 having a triangular cross-section provides 45% more cooling perimeter than the same cold plate 306 having ten coolant chamber volumes 326 having a trapezoid cross-section.

Returning to a discussion of FIG. 4, the sidewall angle 474, denoted as α, which is the angle of the cavity sidewalls 352, 354 with respect to the perimeter or sidewall 366 of the cold plate, which is parallel with the Z-axis of the cold plate 306. The sidewall angle 474 may generally be less than 90 degrees. In some examples, the sidewall angle 474 may be around 55 degrees. In some examples, the sidewall angle 474 may be less than or greater than 55 degrees. In some examples, the sidewall angle 474 may be constrained by the process used to form the cavity sidewalls 352, 354, In some examples, the sidewall angle 474 is constrained by the etch process used to form the cavity sidewalls 352, 354. In some examples, the sidewall angle 474 may be greater than 90 degrees. In some examples, the sidewall angle 474 may be 90 degrees, such that the sidewalls 366 are substantially vertical and are substantially parallel with each other.

Figure 5A:
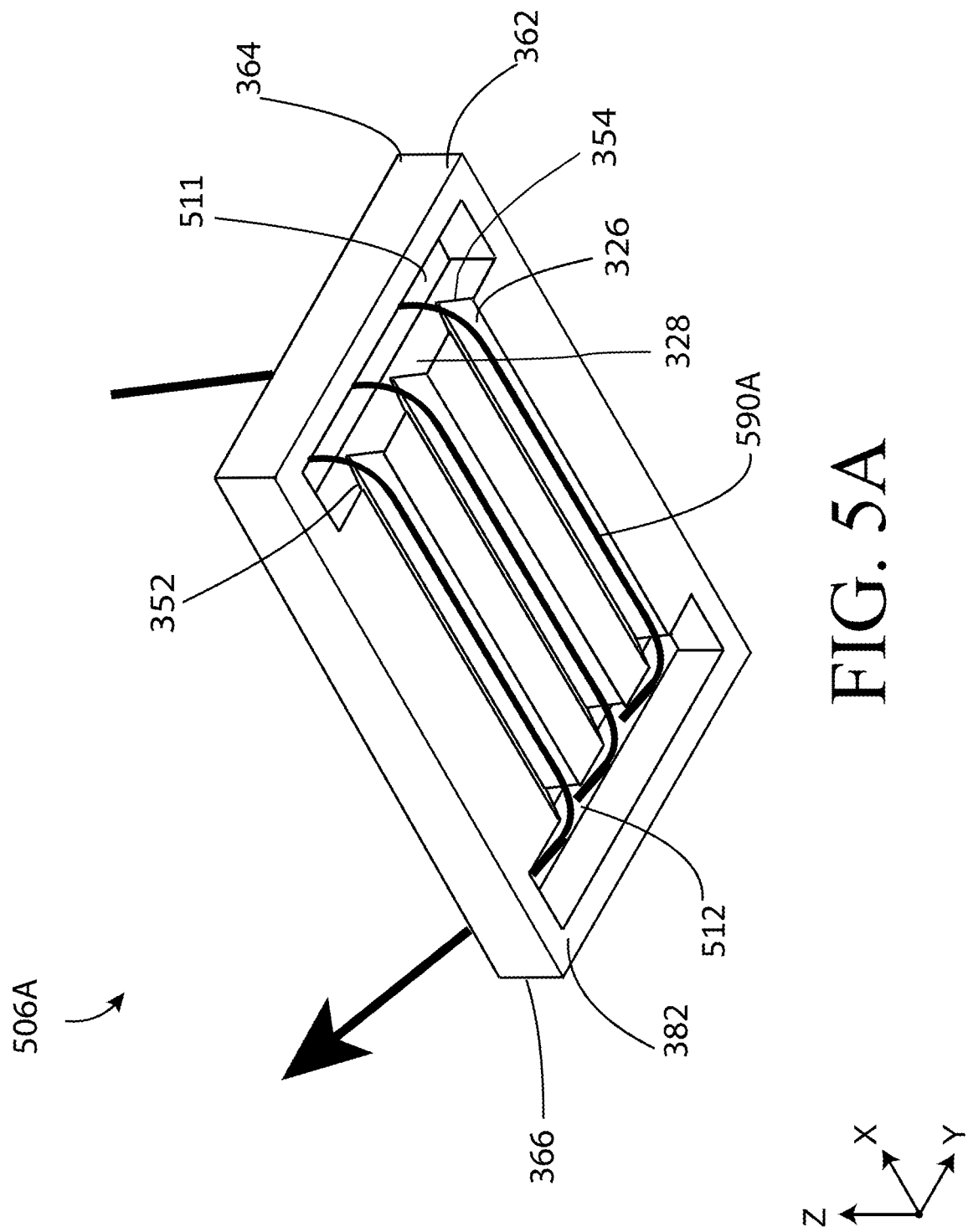
FIG. 5A is an isometric view of an exemplary cold plate.

FIG. 5A shows an isometric view of a representative cold plate 506A. The coolant chamber volumes 326 of the cold plate 506A shown in FIG. 5A generally correspond to those shown as part of the cold plate 406 shown in FIG. 4, and therefore description of like features will be omitted for brevity. The cold plate 506A of FIG. 5A includes an inlet 511, an outlet 512, and three coolant chamber volumes 326 extending laterally between the openings 511, 512. As can be seen in FIG. 5A, the coolant chamber volumes 326 take a generally triangular cross-section and extend along the cold plate 506A between the inlet 511 and the outlet 512. The cold plate 506A of FIG. 5A includes three coolant chamber volumes 326, but as described herein, the cold plate 506A may include more than three or less than three coolant chamber volumes 326.

A fluid flow path 590A is shown in FIG. 5A. The fluid flow path 590A enters the cold plate 506A via the inlet 511, passes through the coolant chamber volumes 326, and out of the outlet 512. In some examples, an inlet manifold may be included to split the fluid flow 590A between the coolant chamber volumes 326 from the inlet 511. In some examples, an outlet manifold may be included to collect the fluid flow from the coolant chamber volumes 326 and pass the fluid flow 590A out of the outlet 512. In some examples, each coolant chamber volume 326 may have its own inlet and/or outlet.

The cavity sidewalls 352, 354 form the walls of the coolant chamber volumes 326. The perimeter sidewall 366 of the cold plate 506A forms the outer wall of the cold plate 506A and defines a perimeter thereof. The cavity sidewalls 352, 354 shown in FIG. 5A are opposing pairs of cavity sidewalls 352, 354.

Figure 5B:
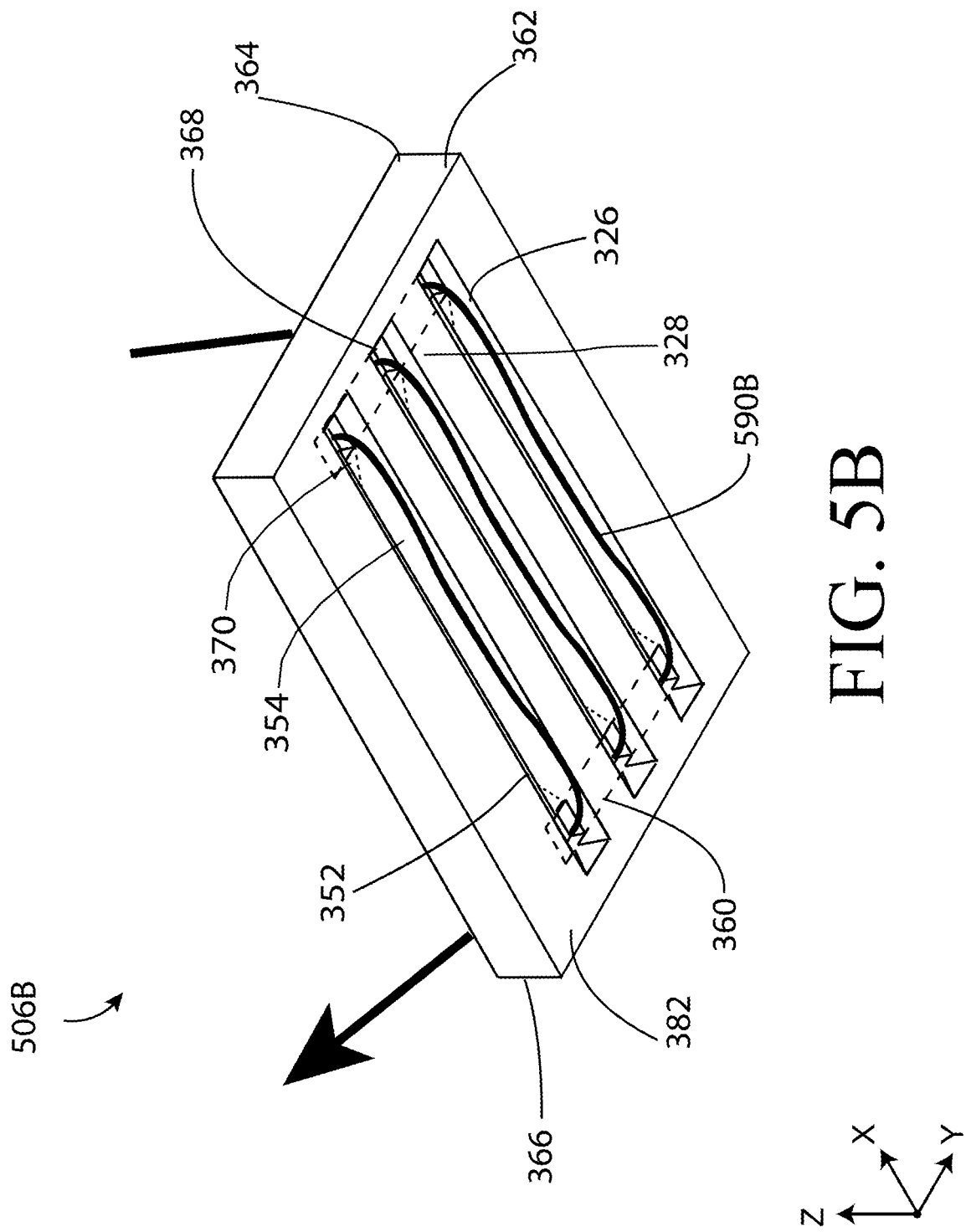
FIG. 5B is an isometric view of a cold plate in accordance with one or more embodiments.

FIG. 5B shows an isometric view of a cold plate 506B in accordance with embodiments of the disclosure. The coolant chamber volumes 326 of the cold plate 506B shown in FIG. 5B generally correspond to those shown as part of the cold plate 406 shown in FIG. 4 and the cold plate 506A shown in FIG. 5A, and therefore description of like features will be omitted for brevity. In a similar way to FIG. 5A, the cold plate 506B of FIG. 5B includes three coolant chamber volumes 326, but as described herein, the cold plate 506 may include more than three or less than three coolant chamber volumes 326.

The cold plate 506B of FIG. 5B includes two openings 360 on the second side of the cold plate 506B which, as described in connection with FIG. 3B, are in fluid communication with the coolant chamber volumes 326. The two openings 360 shown in FIG. 5B may be configured to allow the ingress of fluid into, or egress of fluid out of, the coolant chamber volumes 326 of the cold plate 506B. The two openings 360 which are on the opposing, second side of the cold plate 506B are denoted in FIG. 5B as dotted lines, with the resultant separate apertures 368 visible from the side of the cold plate 506B visible (the first side 384 of the cold plate 506B) in FIG. 5B.

A representative fluid flow path 590B is shown in FIG. 5B, which, in a similar way to that described in connection with FIG. 5A. enters the cold plate 506B via the first of the openings 360, through the separate aperture 368, passes through the coolant chamber volumes 326, and through the separate aperture 368 at the opposite end of the cold plate 506B via the second of the openings 360. As can be seen in FIG. 5B, each divider 328 passes across both of the openings 360 such that each coolant chamber volume 326 has a constant cross-sectional profile along substantially its entire length. Also shown in FIG. 5B are tapered portions 370 which may be formed as part of the etching process of the cold plate 506B. These tapered portions 370 will be discussed later herein, and may reduce turbulence at the ends of the coolant chamber volumes 326 and may promote smoother flow transition into and out of the coolant chamber volumes 326. The tapered portions 370 may help to funnel fluid into the coolant chamber volumes 326 and reduce pressure build-up at the ends of each coolant chamber volume 326. The tapered portions 370 may also reduce turbulence at the ends of each coolant chamber volume 326 and may promote smoother flow transition into and out of the coolant chamber volumes 326.

Figure 5C:
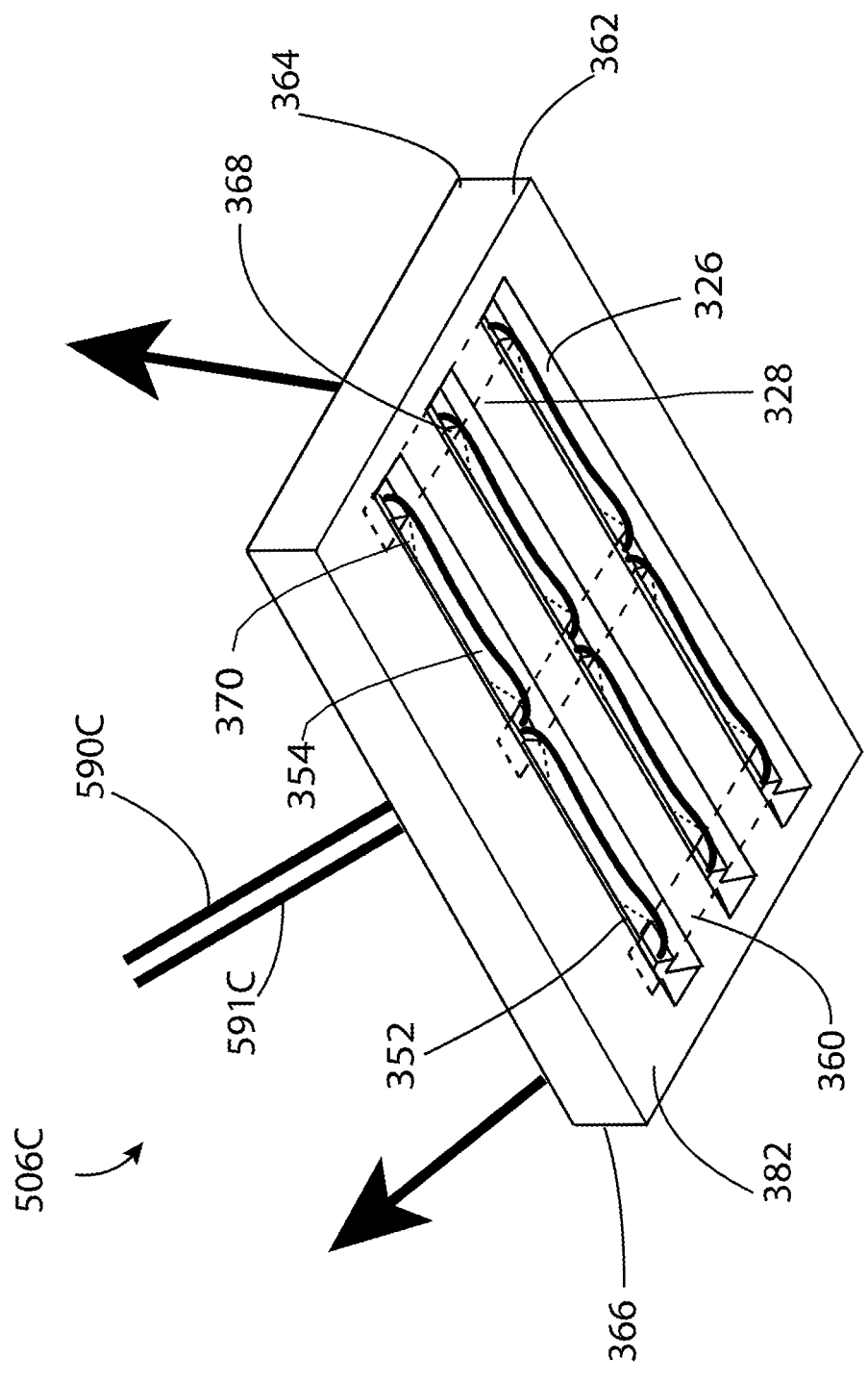
FIG. 5C is an isometric view of a cold plate in accordance with one or more embodiments.

FIG. 5C shows an isometric view of a cold plate 506C in accordance with embodiments of the disclosure. The coolant chamber volumes 326 of the cold plate 506 shown in FIG. 5B generally correspond to those shown as part of the cold plate 406 shown in FIG. 4 and the cold plate 506A shown in FIG. 5A and the cold plate 506B shown in FIG. 5B, and therefore description of like features will be omitted for brevity. In a similar way to FIGS. 5A and 5B, the cold plate 506C of FIG. 5C includes three coolant chamber volumes 326, but as described herein, the cold plate 506C may include more than three or less than three coolant chamber volumes 326.

The cold plate 506C of FIG. 5C includes three openings 360 on the second side of the cold plate 506C which, as described in connection with FIG. 3B, are in fluid communication with the coolant chamber volumes 326. The three openings 360 shown in FIG. 5C may, in a similar way to that described in connection with the cold plate 506B of FIG. 5B, be configured to allow the ingress of fluid into, or egress of fluid out of, the coolant chamber volumes 326 of the cold plate 506B. The three openings 360 which are on the opposing, second side of the cold plate 506C are denoted in FIG. 5B as dotted lines, with the resultant separate apertures 368 visible from the side of the cold plate 506C visible (the first side 386 of the cold plate 506C) in FIG. 5C.

In the case of the cold plate 506C shown in FIG. 5C, the centermost opening 360 is designated as an ingress for fluid or liquid, otherwise termed as an inlet, with the openings 360 at the ends of the coolant chamber volumes 326 designated as an egress for fluid or liquid, otherwise termed as an outlet. The openings 360 in the cold plate 506C may be designated as an ingress or egress in other ways, and in another example, the openings 360 at the ends of the coolant chamber volumes 326 may be designated as an ingress for fluid or liquid, otherwise termed as an inlet, with the centermost opening 360 designated as an egress for fluid or liquid, otherwise termed as an outlet.

Two representative fluid flow paths 590C and 591C are shown in FIG. 5C. The fluid flow paths 590C and 591C enter the coolant chamber volumes 326 of the cold plate 506C by way of the separate apertures 368 and pass through the coolant chamber volumes 326 and out of the cold plate via openings 360 by way of the separate apertures 368. The first representative flow path 590C passes out of a first of the endmost openings 360, and the second representative flow path 590C passes out of a second of the endmost openings 360. Flow paths in this arrangement, with fluid entering the cold plate via the centermost opening 360 and out of endmost openings 360 may give rise to improved cooling of a semiconductor device attached to, and cooled by, the cold plate 506C.

As described in connection with FIG. 5B above, each divider 328 passes across both of the openings 360 in the cold plate 506C such that each coolant chamber volume 326 has a constant cross-sectional profile along substantially its entire length. Also shown in FIG. 5C are tapered portions 370 which may be formed as part of the etching process of the cold plate 506C. These tapered portions 370 will be discussed later herein, and may reduce turbulence at the ends of the coolant chamber volumes 326 and may promote smoother flow transition into and out of the coolant chamber volumes 326.

Figure 6A:
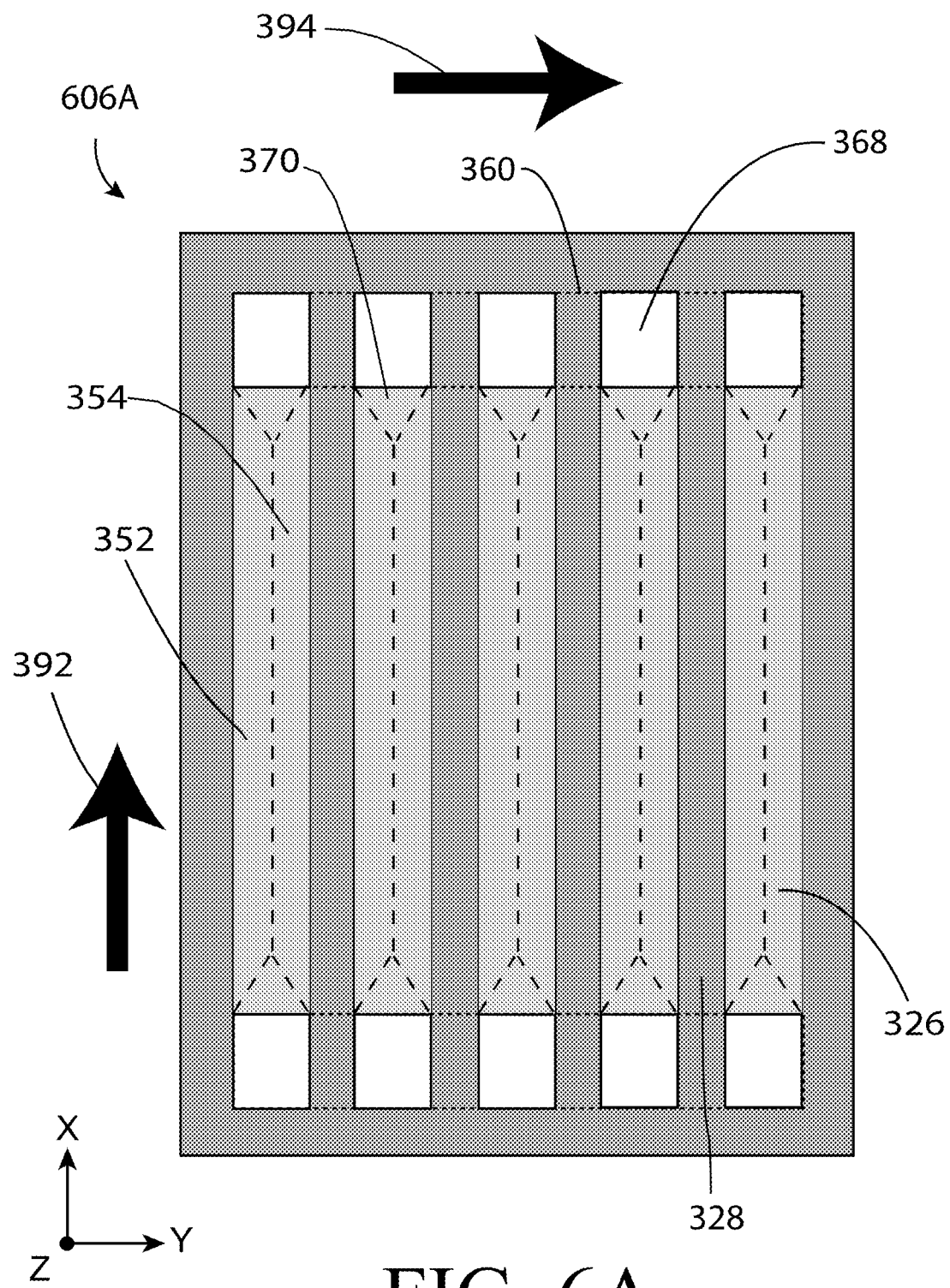
FIG. 6A is a planar schematic view of a cold plate in accordance with one or more embodiments.

FIG. 6A is a planar schematic view of a cold plate 606A in accordance with one or more embodiments and broadly corresponds to the design of cold plate shown in FIG. 5B, so like features will be omitted for brevity. FIG. 6A shows the underside of the cold plate 606A, and the coolant chamber volumes 326 of the cold plate 606A are visible, as are the separate apertures 368 which pass into the openings 360 on the opposing side of the cold plate 606A (and are shown as dotted lines in FIG. 6A). Also visible in FIG. 6A are the tapered portions 370 which may be formed as part of the etching process of the cold plate 606A. The tapered portions 370 may reduce turbulence at the ends of the coolant chamber volumes 326 and may promote smoother flow transition into and out of the coolant chamber volumes 326. The shape of the tapered portions 370 may be defined by the etching process used to etch the cold plate 606A. In some embodiments, the cold plate 606A may be wet etched from both sides thereof simultaneously and the meeting of the etching fronts as part of the wet etching process as described herein may give rise to the tapered portions 370.

The cold plate 606A of FIG. 6A includes five coolant chamber volumes 326, but as described herein, the cold plate 606A may include more than five or less than five coolant chamber volumes 326. The cold plate 606A of FIG. 6A includes two openings 360, with each of the two openings 360 disposed at the ends of the coolant chamber volumes 326. As described in connection with FIG. 5B above, one of the two openings 360 may be an inlet opening and the other of the two openings 360 may be an outlet opening, such that fluid may enter the cold plate 606A by way of the inlet opening, pass along the coolant chamber volumes 326, and pass out of the cold plate by way of the outlet opening.

The direction of the openings 360 of the cold plate 606A is different from the direction of the coolant chamber volumes 326. The coolant chamber volumes 326 run in a first direction 392, and the openings 360 run in a second direction 394. In the case of the cold plate 606A shown in FIG. 6A, the second direction 394 which is the direction of the openings 360 is perpendicular to the first direction 392 which is the direction of the coolant chamber volumes 326. In some cases, the direction of the openings 360 may not be perpendicular to the direction of the coolant chamber volumes 326, and may, for example, lie at greater than or less than ninety degrees with respect to the direction of the coolant chamber volumes 326.

As described above with reference to FIGS. 5B and 6C, each divider 328 of the cold plate 606A passes across both of the openings 360 such that each coolant chamber volume 326 has a constant cross-sectional profile along substantially its entire length. This may give rise to a more uniform liquid velocity in each coolant chamber volume 326. As described herein, coolant chamber volumes 326 which have a closed end may, in general, have a more constant velocity of fluid or liquid passing through the coolant chamber volume 326. This may in turn improve the cooling efficiency of each coolant chamber volume 326 and thus the overall cooling efficiency of the cold plate 606A.

Figure 6B:
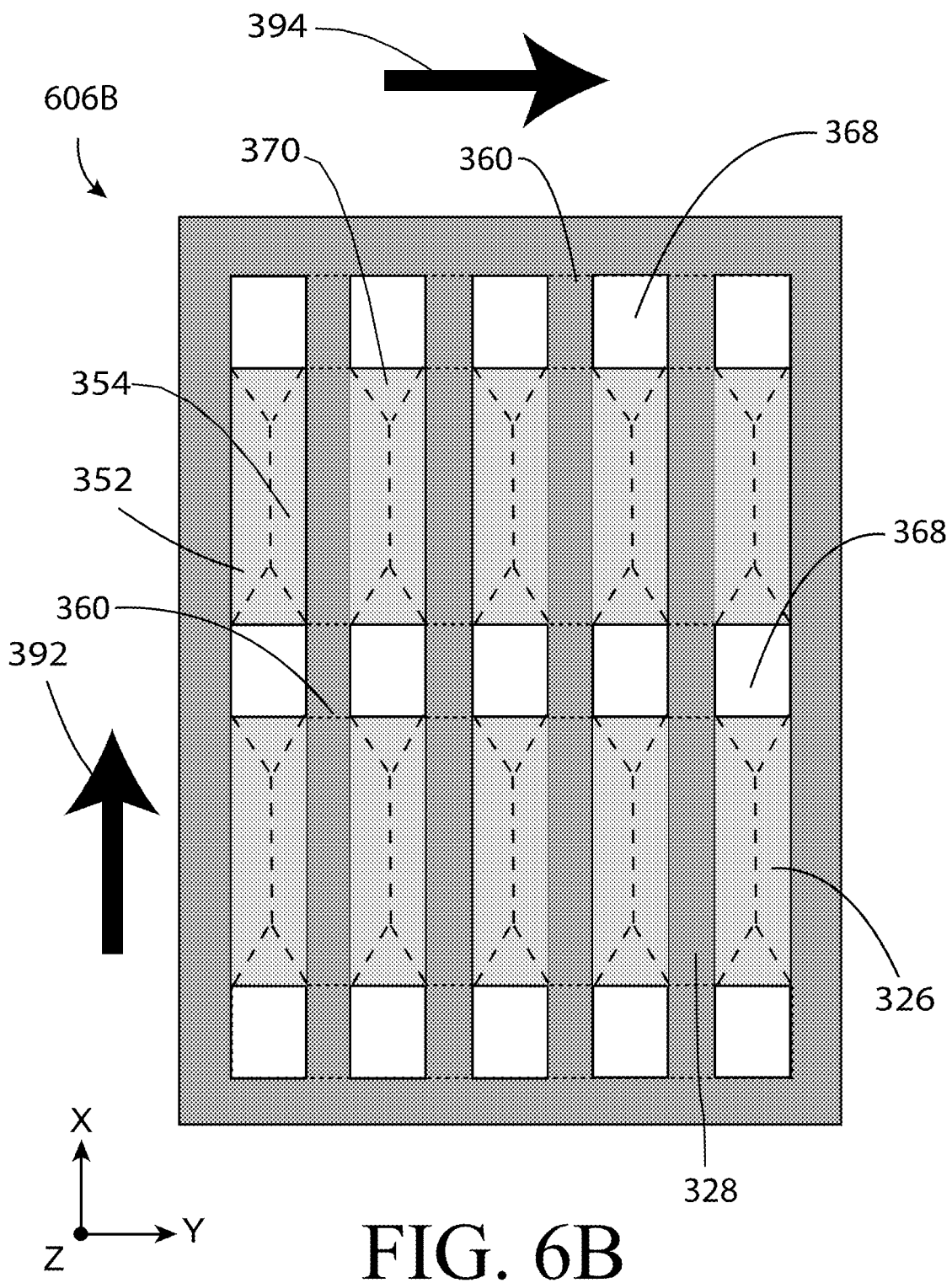
FIG. 6B is a is a planar schematic view of a cold plate in accordance with one or more embodiments.

FIG. 6B is a planar schematic view of a cold plate 606B in accordance with one or more embodiments and broadly corresponds to the design of cold plate shown in FIG. 5C, so like features will be omitted for brevity. FIG. 6B shows the underside of the cold plate 606A, and the coolant chamber volumes 326 of the cold plate 606B are visible, as are the separate apertures 368 which pass into the openings 360 on the opposing side of the cold plate 606B (and are shown as dotted lines in FIG. 6B). Also visible in FIG. 6B are the tapered portions 370 which may be formed as part of the etching process of the cold plate 606B. The tapered portions 370 may reduce turbulence at the ends of the coolant chamber volumes 326 and may promote smoother flow transition into and out of the coolant chamber volumes 326. As described above an in connection with FIG. 6A, the shape of the tapered portions 370 may be defined by the etching process used to etch the cold plate 606B. In some embodiments, the cold plate 606B may be wet etched from both sides thereof simultaneously and the meeting of the etching fronts as part of the wet etching process as described herein may give rise to the tapered portions 370.

The cold plate 606B of FIG. 6B includes five coolant chamber volumes 326, but as described herein, the cold plate 606B may include more than five or less than five coolant chamber volumes 326. The cold plate 606B of FIG. 6B includes three openings 360, with an opening 360 disposed substantially mid-way along the length of the coolant chamber volumes 326, and the other two openings 360 disposed at the ends of the coolant chamber volumes 326. As described in connection with FIG. 5C above, the centermost of the three openings 360 may be an inlet opening and the other of the two openings 360 may be an outlet opening, such that fluid may enter the cold plate 606B by way of the inlet opening in the middle of the cold plate 606B, pass along the coolant chamber volumes 326, and pass out of the cold plate 606B by way of the outlet openings.

As described in connection with FIG. 6A above, the direction of the openings 360 of the cold plate 606B is different from the direction of the coolant chamber volumes 326. The coolant chamber volumes 326 run in a first direction 392, and the openings 360 run in a second direction 394. In the case of the cold plate 606B shown in FIG. 6B, the second direction 394 which is the direction of the openings 360 is perpendicular to the first direction 392 which is the direction of the coolant chamber volumes 326. In some cases, the direction of the openings 360 may not be perpendicular to the direction of the coolant chamber volumes 326, and may, for example, lie at greater than or less than ninety degrees with respect to the direction of the coolant chamber volumes 326.

As described above with reference to FIGS. 5B and 6C, each divider 328 of the cold plate 606B passes across both of the openings 360 such that each coolant chamber volume 326 has a constant cross-sectional profile along substantially its entire length. This may give rise to a more uniform liquid velocity in each coolant chamber volume 326. As described herein, coolant chamber volumes 326 which have a closed end may, in general, have a more constant velocity of fluid or liquid passing through the coolant chamber volume 326. This may in turn improve the cooling efficiency of each coolant chamber volume 326 and thus the overall cooling efficiency of the cold plate 606B.

Figure 7A:
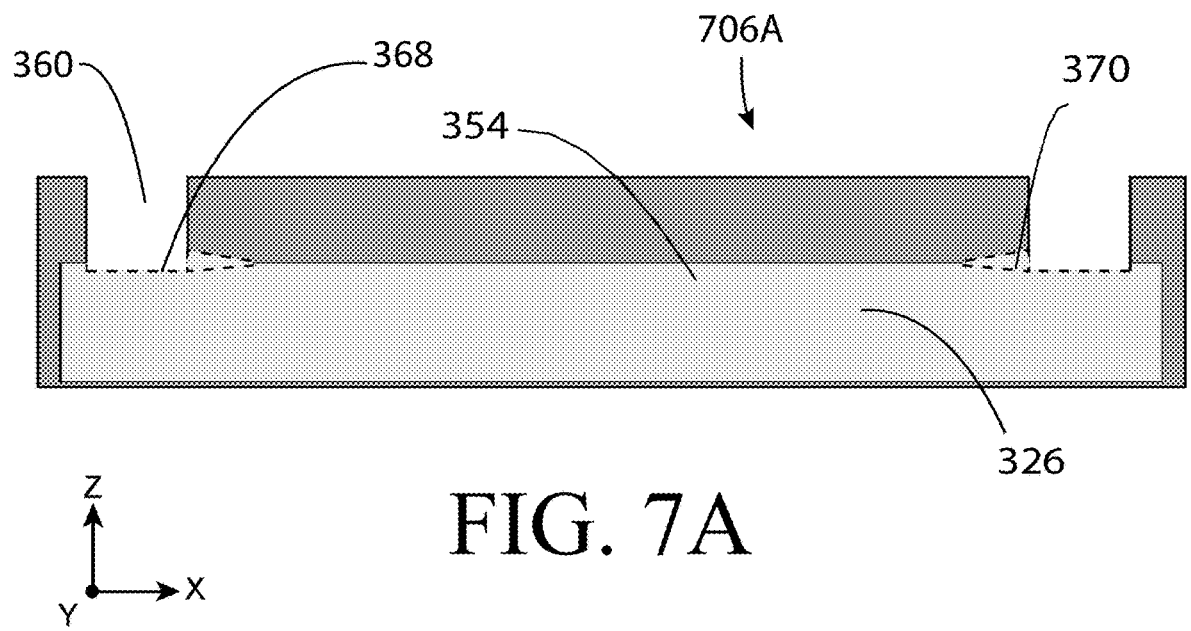
FIG. 7A is a schematic side view of a cold plate in accordance with one or more embodiments.

FIG. 7A is a side schematic view of a cold plate 706A in accordance with one or more embodiments and broadly corresponds to the design of cold plate 606A shown in FIG. 6A, so like features will be omitted for brevity. In FIG. 7A, a coolant chamber volume 326 of the cold plate 706A is visible, as are the separate apertures 368 which pass into the openings 360 on the opposing side of the cold plate 706A (and are shown as dotted lines in FIG. 7A). Also visible in FIG. 7A are the tapered portions 370 which may be formed as part of the etching process of the cold plate 706A.

As described herein, the tapered portions 370 may reduce turbulence at the ends of the coolant chamber volumes 326 and may promote smoother flow transition into and out of the coolant chamber volumes 326. The shape of the tapered portions 370 may be defined by the etching process used to etch the cold plate 706A. In some embodiments, the cold plate 706A may be wet etched from both sides thereof simultaneously and the meeting of the etching fronts as part of the wet etching process as described herein may give rise to the tapered portions 370.

The cold plate 706A of FIG. 7A includes two openings 360, with each of the two openings 360 disposed at the ends of the visible coolant chamber volume 326. As described in connection with FIG. 6A above, one of the two openings 360 may be an inlet opening and the other of the two openings 360 may be an outlet opening, such that fluid may enter the cold plate 706A by way of the inlet opening, pass along the coolant chamber volumes 326, and pass out of the cold plate 706A by way of the outlet opening.

Figure 7B:
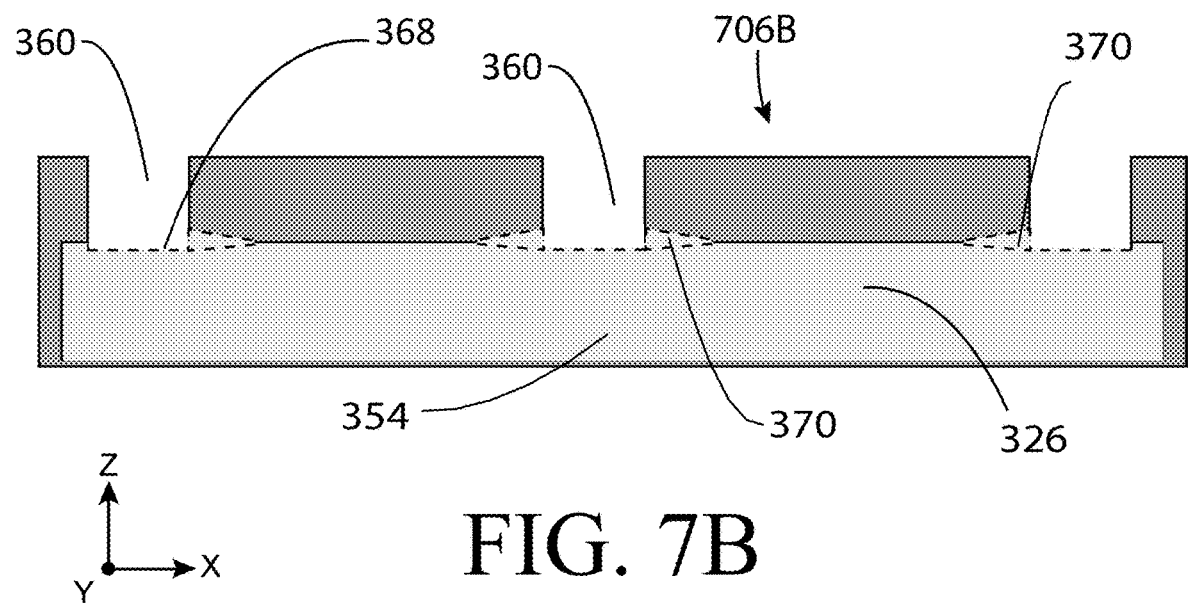
FIG. 7B is a schematic side view of a cold plate in accordance with one or more embodiments.

FIG. 7B is a side schematic view of a cold plate 706B in accordance with one or more embodiments and broadly corresponds to the design of cold plate 606B shown in FIG. 6B, so like features will be omitted for brevity. In FIG. 7B, a coolant chamber volume 326 of the cold plate 706B is visible, as are the separate apertures 368 which pass into the openings 360 on the opposing side of the cold plate 706B (and are shown as dotted lines in FIG. 7B). Also visible in FIG. 7B are the tapered portions 370 which may be formed as part of the etching process of the cold plate 706B.

As described herein, the tapered portions 370 may reduce turbulence at the ends of the coolant chamber volumes 326 and may promote smoother flow transition into and out of the coolant chamber volumes 326. The shape of the tapered portions 370 may be defined by the etching process used to etch the cold plate 706A. In some embodiments, the cold plate 706A may be wet etched from both sides thereof simultaneously and the meeting of the etching fronts as part of the wet etching process as described herein may give rise to the tapered portions 370.

The cold plate 706B of FIG. 7B includes three openings 360, with an opening 360 disposed substantially mid-way along the length of the visible coolant chamber volume 326, and the other two openings 360 disposed at the ends of the visible coolant chamber volume 326. As described in connection with FIG. 6B above, the centermost of the three openings 360 may be an inlet opening and the other of the two openings 360 may be an outlet opening, such that fluid may enter the cold plate 706B by way of the inlet opening in the middle of the cold plate 706B, pass along the coolant chamber volumes 326, and pass out of the cold plate 706B by way of the outlet openings.

Figure 8:
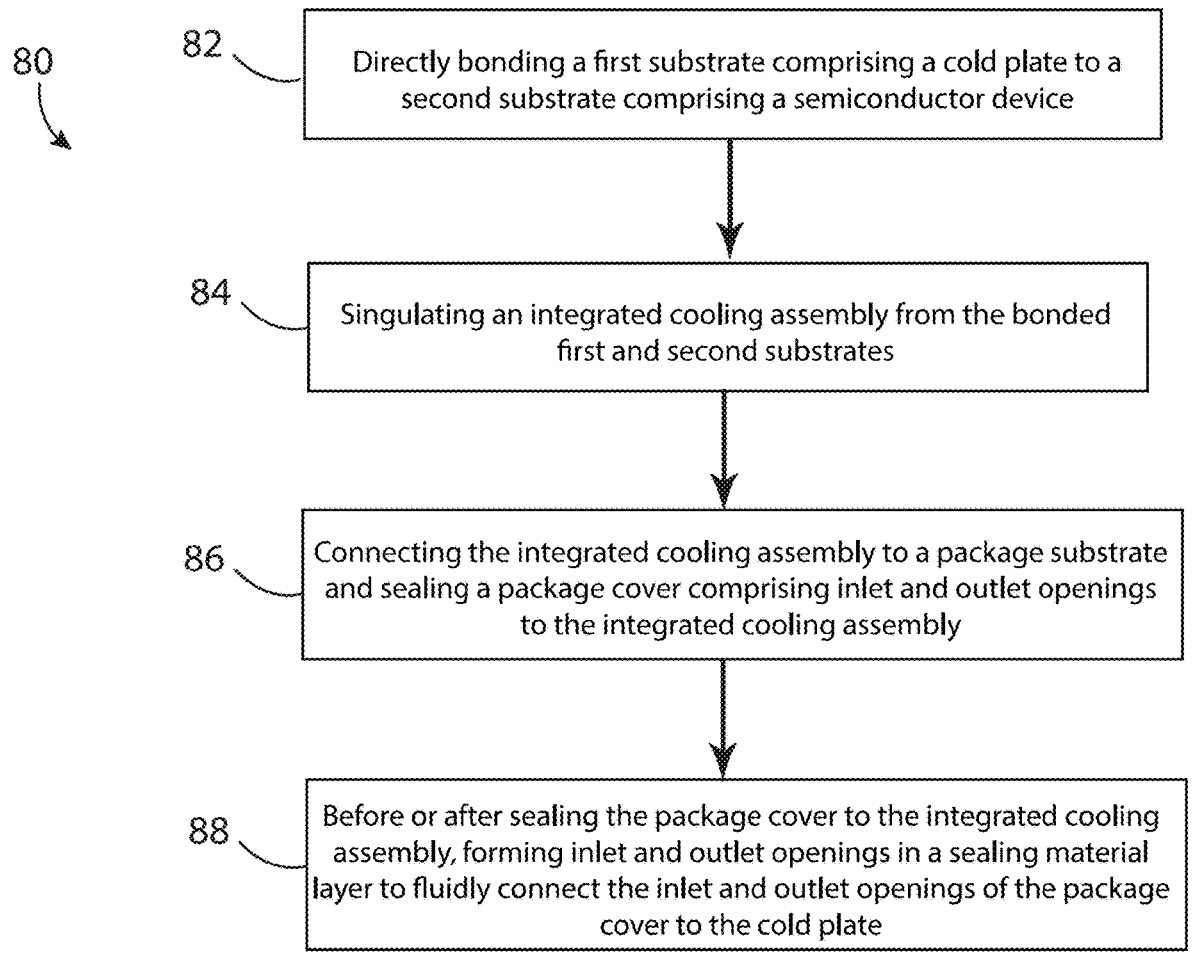
FIG. 8 shows a method that can be used to manufacture the device package described herein.

FIG. 8 is a flow diagram showing a method 80 of forming an integrated cooling assembly, according to embodiments of the present disclosure. Generally, the method 80 includes bonding a first substrate comprising one or more cold plates 206 to a second substrate comprising one or more semiconductor devices 204, and singulating one or more integrated cooling assemblies 203 from the bonded first and second substrates. For example, a wafer (bare or reconstituted wafer) comprising one or more cold plates 206 can be directly bonded to another wafer (bare or reconstituted wafer) comprising one or more semiconductor devices 204.

It will be understood that the first substrate may be a cold plate die or part of a wafer of cold plates. Further, the second substrate may be a semiconductor device die or part of a wafer of semiconductor devices 204. Therefore, the method 80 may include die-to-die direct bonding (e.g., cold plate die to semiconductor device die), wafer-to-die direct bonding (e.g., cold plate die to semiconductor device wafer, or cold plate wafer to semiconductor device die), and wafer-to-wafer direct bonding (e.g., cold plate wafer to semiconductor device wafer). It will be understood that the singulation step (discussed in relation to block 84, below) may not be required for a die-to-die direct bonding operation.

For simplicity, the following description is focused on forming one integrated cooling assembly 203 comprising one cold plate 206 and one semiconductor device 204. However, as mentioned above, in some embodiments, the first substrate may comprise plural cold plates 206 and the second substrate may comprise plural semiconductor devices 204, such that plural integrated cooling assemblies 203 may be formed from the first and second substrates.

At block 82, the method 80 includes directly bonding the first substrate (e.g., a monocrystalline silicon wafer) comprising a cold plate 206 to the second substrate (e.g., a monocrystalline silicon wafer) comprising a semiconductor device 204 without an intervening adhesive.

In some embodiments, the first substrate may be etched using a patterned mask layer formed on its surface to form features of the cold plate 206. An anisotropic etch process may be used, which uses inherently differing etch rates for the silicon material as between $\{100\}$ plane surfaces and $\{111\}$ plane surfaces when exposed to an anisotropic etchant.

In some embodiments, the etching process is controlled to where the etch rates of the substrate surfaces have a ratio between about 1:10 and about 1:200, such as between about 1:10 and about 1:100, for example between about 1:10 and 1:50, or between about 1:25 and 1:75. Examples of suitable anisotropic wet etchants include aqueous solutions of potassium hydroxide (KOH), ethylene diamine and pyrocatechol (EPD), ammonium hydroxide ($HN_4OH$), hydrazine ($N_2H_4$), or tetra methyl ammonium hydroxide (TMAH). The actual etch rates of the silicon substrate depend on the concentration of the etchant in the aqueous solution, the temperature of the aqueous solution, and a concentration of the dopant in the substrate (if any). Typically, the mask layer is formed of a material that is selective to anisotropic etch compared to the underlying monocrystalline silicon substrate. Examples of suitable mask materials include silicon oxide ($Si_xO_y$) or silicon nitride ($Si_xN_y$). In some embodiments, the mask layer has a thickness of about 100 nm or less, such as about 50 nm or less, or about 30 nm or less. The mask layer may be patterned using any suitable combination of lithography and material etching patterning methods.

In some embodiments, a duration of the etching process is controlled to achieve a coolant chamber volume having a triangular cross-section.

The second substrate may include a bulk material, and a plurality of material layers disposed on the bulk material. The bulk material may include any semiconductor material suitable for manufacturing semiconductor devices, such as silicon, silicon carbide, silicon germanium, germanium, group III-V semiconductor materials, group II-VI semiconductor materials, or combinations thereof. While some high-performance processors like CPUs, GPUs, neural processing units (NPUs), and tensor processing units (TPUs) are typically made out of silicon, some other high power density (hence substantial heat-generating) devices may comprise silicon carbide or gallium nitride, for example. In some embodiments, the second substrate may include a monocrystalline wafer, such as a silicon wafer, a plurality of device components formed in or on the silicon wafer, and a plurality of interconnect layers formed over the plurality of device components. In other embodiments, the second substrate may comprise a reconstituted substrate, e.g., a substrate formed from a plurality of singulated devices embedded in a support material. In some embodiments, each semiconductor device may have its own individual cold plate fabricated through a reconstitution process.

The bulk material of the second substrate may be thinned after the semiconductor device 204 is formed using one or more backgrinding, etching, and polishing operations that remove material from the backside. Thinning the second substrate may include using a combination of grinding and etching processes to reduce the thickness (in the Z-direction) to about 450 μm or less, such as about 200 μm or less, or about 150 μm or less or about 50 μm or less. After thinning, the backside 220 may be polished to a desired smoothness using a chemical mechanical polishing (CMP) process, and the dielectric material layer may be deposited thereon. In some embodiments, the dielectric material layer may be polished to a desired smoothness to prepare the second substrate for the bonding process. In some embodiments, the method 80 includes forming a plurality of metal features in the dielectric material layer in preparation for a hybrid bonding process, such as by use of a damascene process.

In some embodiments, the active side of the second substrate is temporarily bonded to a carrier substrate (not shown) before or after the thinning process. When used, the carrier substrate provides support for the thinning operation and/or for the thinned material to facilitate substrate handling during one or more of the subsequent manufacturing operations described herein.

Here, the method 80 may include forming dielectric layers on one or both the first and second substrates, and directly bonding includes forming dielectric bonds between a first dielectric material layer of the first substrate and a second dielectric material layer of the second substrate (or forming dielectric bonds between one substrate and a dielectric material layer of the other substrate). Direct bonding processes join dielectric layers by forming strong chemical bonds (e.g., covalent bonds) between the dielectric layers.

Generally, directly bonding the surfaces (of the dielectric material layers formed on the first and second substrates) includes preparing, aligning, and contacting the surfaces. Examples of dielectric material layers include silicon oxide, silicon nitride, silicon oxynitride, and silicon carbonitride. Preparing the surfaces may include smoothing the respective surfaces to a desired surface roughness, such as between 0.1 to 3.0 nm RMS, activating the surfaces to weaken or open chemical bonds in the dielectric material, and terminating the surfaces with a desired species. Smoothing the surfaces may include polishing the first and second substrates using a CMP process. Activating and terminating the surfaces with a desired species may include exposing the surfaces to radical species formed in a plasma. The bond interface between the bonded dielectric layers can include a higher concentration of materials from the activation and/or last chemical treatment processes compared to the bulk of the bonding layers. For example, in some embodiments that utilize a nitrogen plasma for activation, a nitrogen concentration peak can be formed at the bond interface. In some embodiments, the nitrogen concentration peak may be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with $NH_2$ molecules, yielding a nitrogen-terminated surface. In embodiments that utilize an oxygen plasma for activation, an oxygen concentration peak can be formed at the bond interface between non-conductive bonding surfaces.

In some embodiments, the plasma is formed using a nitrogen-containing gas, e.g., $N_2$, and the terminating species includes nitrogen, or nitrogen and hydrogen. In some embodiments, fluorine may also be present within the plasma. In some embodiments, the surfaces may be activated using a wet cleaning process, e.g., by exposing the surfaces to an aqueous ammonia solution. In some embodiments, the dielectric bonds may be formed using a dielectric material layer deposited on only one of the first and second substrates, but not on both. In those embodiments, the direct dielectric bonds may be formed by contacting the deposited dielectric material layer of one of the first and second substrates directly with a bulk material surface (or such a surface with a native oxide) of the other substrate.

Directly forming direct dielectric bonds between the first and second substrates at block 82 may include bringing the prepared and aligned surfaces into direct contact at a temperature less than 150° C., such as less than 100° C., for example, less than 30° C., or about room temperature, e.g., between 20° C. and 30° C. Without intending to be bound by theory, in the case of directly bonding surfaces terminated with nitrogen and hydrogen (e.g., $NH_2$ groups), it is believed that the hydrogen terminating species diffuse from the interfacial bonding surfaces, and chemical bonds are formed between the remaining nitrogen species during the direct bonding process. In some embodiments, the direct bond is strengthened using an anneal process, where the substrates are heated to and maintained at a temperature of greater than about 30° C. and less than about 450° C., for example, greater than about 50° C. and less than about 250° C., or about 150° C., for a duration of about 5 minutes or more, such as about 15 minutes. Typically, the bonds will strengthen over time even without the application of heat. Thus, in some embodiments, the method does not include heating the substrates.

In embodiments where the first and second substrates are bonded using hybrid dielectric and metal bonds, the method 80 may further include planarizing or recessing the metal features below the dielectric field surface before contacting and bonding the dielectric material layers. After the dielectric bonds are formed, the first and second substrates may be heated to a temperature of 150° C. or more and maintained at the elevated temperature for a duration of about 1 hour or more, such as between 8 and 24 hours, to form direct metallurgical bonds between the metal features.

Suitable direct dielectric and hybrid bonding technologies that may be used to perform aspects of the methods described herein include ZiBond® and DBI®, each of which are commercially available from Adeia Holding Corp., San Jose, CA, USA.

At block 84, the method 80 includes singulating at least one integrated cooling assembly 203 from the bonded first and second substrates. Singulation after bonding may impart distinctive structural characteristics on the integrated cooling assembly 203 as the bonding surface of the cold plate 206 has the same perimeter as the backside of the semiconductor device 204 bonded thereto. Thus, the sidewalls (e.g., side surfaces) of the cold plate 206 are typically flush with the edges (e.g., side surfaces) of the semiconductor device 204 about their common perimeters. In some embodiments, the cold plate 206 is singulated from the first substrate using a process that cuts or divides the first substrate in a vertical plane, i.e., in the Z-direction. In those embodiments, the side surfaces of the cold plate 206 are substantially perpendicular to the backside 220 of the semiconductor device 204, i.e., a horizontal (X-Y) plane of an attachment interface between the semiconductor device 204 and the cold plate 206. In some embodiments, the cold plate 206 is singulated using a saw or laser dicing process.

At block 86, the method 80 may include connecting the integrated cooling assembly 203 to the package substrate 202 and sealing a package cover 208 comprising inlet and outlet openings 212 to the integrated cooling assembly 203 by use of a molding compound that, when cured, forms a sealing material layer 222.

At block 88, the method 80 may include, before or after sealing the package cover 208 to the integrated cooling assembly 203, forming inlet and outlet openings 222A in the sealing material layer 222 to fluidly connect the inlet and outlet openings 212 of the package cover 208 to the cold plate 206.

Figure 9A:
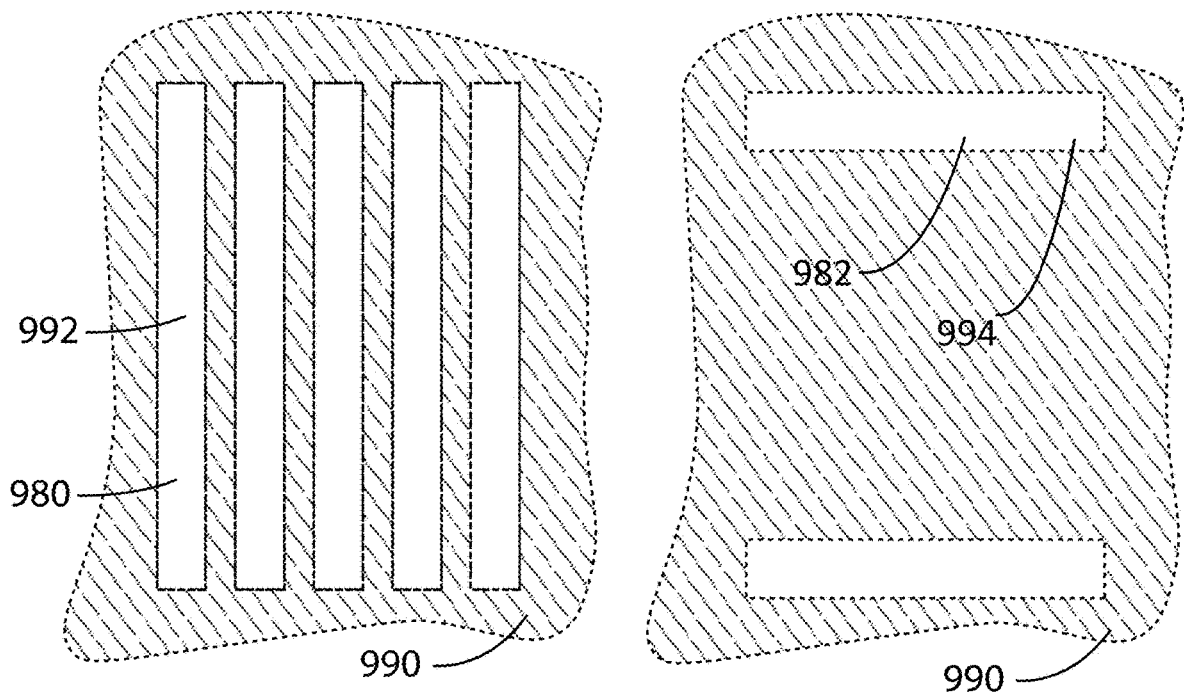
FIG. 9A is a schematic view of mask layers for etching of a cold plate in accordance with one or more embodiments.

FIG. 9A is a schematic view of mask layers 990 for etching of a cold plate in accordance with one or more embodiments and broadly corresponds to the etched cold plate 606A of FIG. 6A. A portion of the mask layer 990 is shown in FIG. 9A, and openings of a first mask layer 980 which may be deposited on a first side of a substrate and openings of a second mask layer 982 which may be deposited on a second side of a substrate are shown. A first side of the substrate 992 is visible through the openings of the first mask layer 980 and a second side of the substrate 994 is visible through the openings of the second mask later 982. The openings of the first mask layer 980, after etching of the substrate, give rise to coolant chamber volumes 326 and dividers 328 as described herein, and the openings of the second mask layer 982, after etching of the substrate, give rise to openings 360 as described herein. The second mask layer 982 gives rise to two openings 360 in the second side of the cold plate, which may be an inlet or outlet for the cold plate as described herein.

The openings 360 which are created by the second mask layer 982 are substantially perpendicular to the coolant chamber volumes 326 and dividers 328, but the direction of the first and second mask layers 980, 982 may not be perpendicular to one another, and the angle of the first mask layer 980 with respect to the second mask layer 982 may be greater or lesser than 90 degrees. IR imaging may be used to line up the first mask layer 980 and the second mask layer 982 from front to back.

Figure 9B:
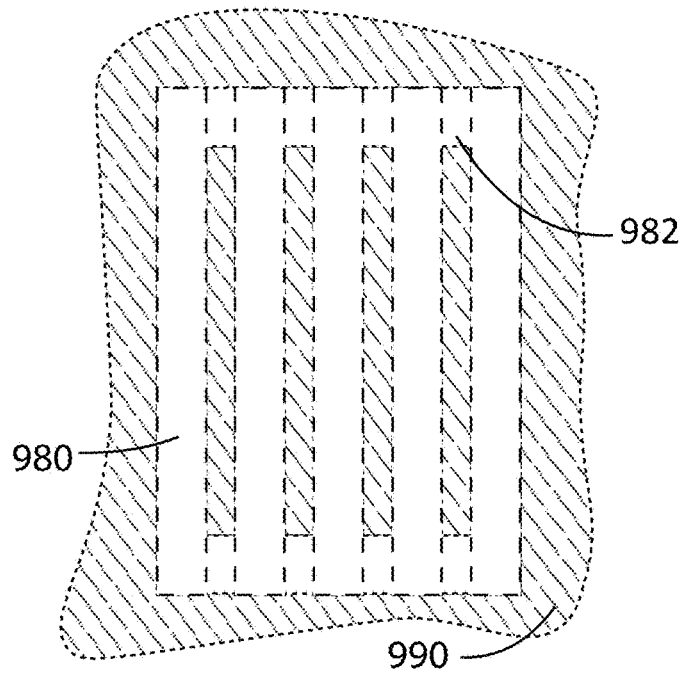
FIG. 9B is an overlaid schematic view of mask layers for etching of a cold plate in accordance with one or more embodiments.

FIG. 9B shows a portion of the mask layer 990, with the first mask layer 980 and second mask layer 982 overlaid to demonstrate the double-sided etch pattern for cold plates as described herein. The first mask layer 980 and second mask layer 982, when etched, give rise to a cold plate which broadly corresponds to the design of cold plate 606A shown in FIG. 6A and cold plate 706A shown in FIG. 7A. The etching of the two patterns therefore gives rise to a cold plate in which the dividers 328 of the first side 382 of the cold plate extend all of the way across the openings 360 etched into the second side of the cold plate, and such that the coolant chamber volumes 328 have a substantially constant cross-section along their lengths.

Figure 9C:
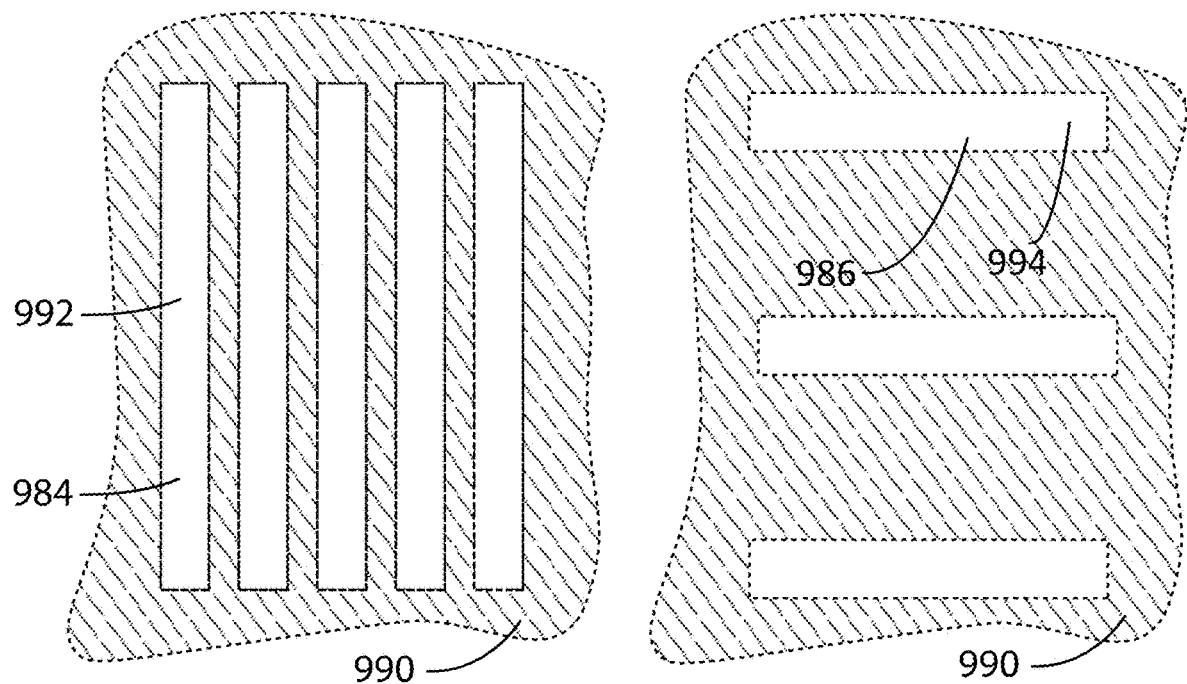
FIG. 9C is a schematic view of mask layers for etching of a cold plate in accordance with one or more embodiments.

FIG. 9C is a schematic view of mask layers 990 for etching of a cold plate in accordance with one or more embodiments and broadly corresponds to the etched cold plate 606B of FIG. 6B. A portion of the mask layer 990 is shown in FIG. 9C, and openings of a third mask layer 984 which may be deposited on a first side of a substrate and openings of a fourth mask layer 986 which may be deposited on a second side of a substrate are shown. As with FIG. 9A, a first side of the substrate 992 is visible through the openings of the third mask layer 984 and a second side of the substrate 994 is visible through the openings of the fourth mask later 986. The openings of the third mask layer 984, after etching of the substrate, give rise to coolant chamber volumes 326 and dividers 328 as described herein, and the openings of the fourth mask layer 984, after etching of the substrate, give rise to openings 360 as described herein. The fourth mask layer 984 gives rise to three openings 360 in the second side of the cold plate, which may be an inlet or outlet for the cold plate as described herein.

The openings 360 which are created by the fourth mask layer 984 are substantially perpendicular to the coolant chamber volumes 326 and dividers 328, but the direction of the third and fourth mask layers 984, 986 may not be perpendicular to one another, and the angle of the third mask layer 984 with respect to the second mask layer may be greater or lesser than 90 degrees. IR imaging may be used to line up the third mask layer 984 and the fourth mask layer 984 from front to back.

Figure 9D:
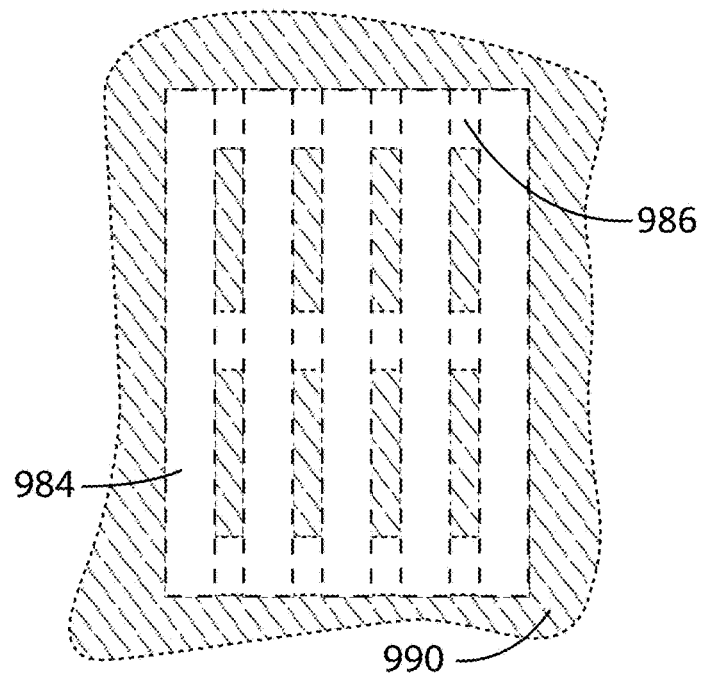
FIG. 9D is an overlaid schematic view of mask layers for etching of a cold plate in accordance with one or more embodiments.

FIG. 9D shows the third mask layer 984 and fourth mask layer 984 overlaid to demonstrate the double-sided etch pattern for cold plates as described herein. The third mask layer 984 and fourth mask layer 984, when etched, give rise to a cold plate which broadly corresponds to the design of cold plate 606B shown in FIG. 6B and cold plate 706B shown in FIG. 7B. The etching of the two patterns therefore gives rise to a cold plate in which the dividers 328 of the first side of the cold plate extend all of the way across the openings 360 etched into the second side 384 of the cold plate, and such that the coolant chamber volumes 328 have a substantially constant cross-section along their lengths.

The first and third mask layers 980, 984 open rectangular channels which are not connected at the ends or middle, and have a width and pitch to achieve the desired final etch depth and equal coolant chamber volume 326 and divider 328 geometry for optimal cooling. The second and fourth mask layers 982, 986 open rectangular openings which are spaced to line up with the inlet and outlet ends of the coolant chamber volumes 326 and, in the case of the fourth mask layer 986, a central opening. The separate apertures 368 described herein are formed between the coolant chamber volumes 326 and openings 360 as part of the etching process.

Referring generally to the mask layers 990 shown in FIGS. 9A, 9B, 9C, and 9D, both sides of a substrate may be etched concurrently as part of a double-sided etching process, which may be a wet etch as described herein. The concurrent double-sided wet etch gives rise to the tapered portions 370 described herein, as a result of the meeting of the etching fronts which happens as part of the double-sided wet etching process. The separate apertures 368 described herein are also created by the double-sided wet etch and are formed between the coolant chamber volumes 326 and the openings 360 and pass all of the way through the substrate.

The etch depth of the coolant chamber volumes 326 and openings 360 is approximately the same, when the substrate is etched from both sides. In some cases, the depth of the coolant chamber volumes 326 and openings 360 is around 500 μm. In the case of a total substrate thickness of around 730 μm, the etching leaves approximately 230 μm of material remaining. The thickness of the dividers 328 which extend across the openings 360 is around 230 μm, and the dividers do not fully block fluid flow from one channel into the next.

Figure 10:
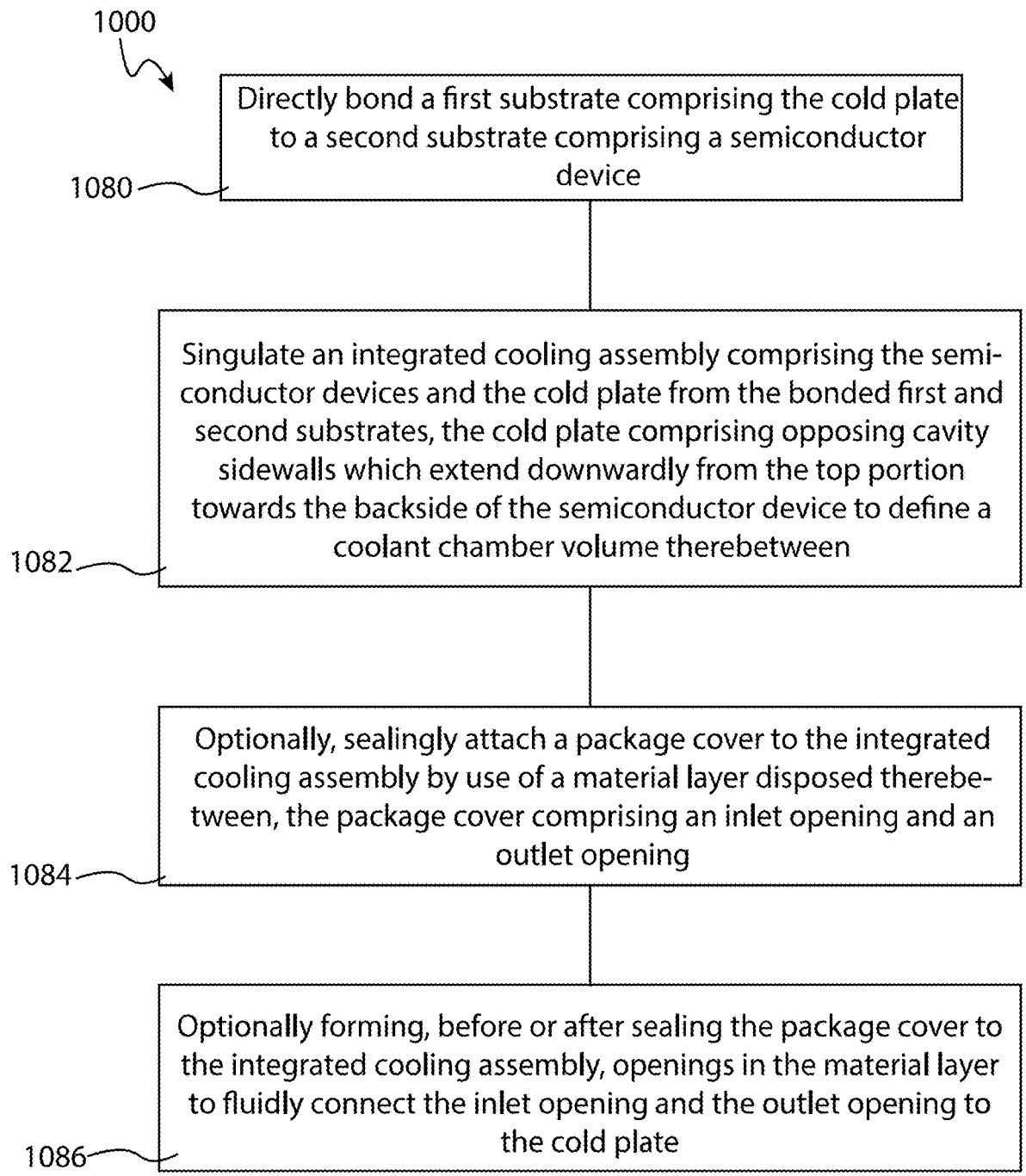
FIG. 10 shows a method that can be used to manufacture the integrated cooling assemblies described herein.

FIG. 10 is a flow diagram setting forth a method 1000 of forming an integrated cooling assembly, according to embodiments of the disclosure.

The method 1000 may include forming dielectric layers on the cold plate and the second substrate (i.e., on upper exposed surfaces of the semiconductor device), and directly bonding includes forming dielectric bonds between a first dielectric material layer of the cold plate and a second dielectric material layer of the semiconductor device.

At block 1080, the method 1000 includes directly bonding a first substrate (e.g., a monocrystalline silicon wafer) comprising the cold plate 206, 306 to a second substrate (e.g., a monocrystalline silicon wafer) comprising a semiconductor device (e.g., semiconductor device 204, 304). For example, the first substrate may be etched using a patterned mask layer formed on surfaces of the respective substrates. The anisotropic etch process uses inherently differing etch rates for the silicon material which is exposed to an anisotropic etchant when the patterned mask layer is formed. It will be understood that, in some embodiments, the first substrate and/or the second substrate may be a semiconductor device (e.g., a die), such that block 1080 may include direct die-to-die bonding and direct wafer-to-die bonding, in addition to wafer-to-wafer bonding.

It will be understood that first substrate may be a semiconductor device die or part of a wafer of semiconductor devices. Further, the second substrate may be a cold plate die or part of a wafer of cold plates. Therefore, block 1080 may include direct die-to-die bonding (e.g., cold plate die to semiconductor device die), direct wafer-to-die bonding (e.g., cold plate die to semiconductor device wafer, or cold plate wafer to semiconductor device die), and wafer-to-wafer bonding (e.g., cold plate wafer to semiconductor device wafer).

At block 1082, the method 1000 includes singulating an integrated cooling assembly 203, 303, comprising the semiconductor device 204, 304 and the cold plate 206, 306 from the bonded first and second substrates.

At block 1084, the method 1000 comprises sealingly attaching a package cover to the integrated cooling assembly by use of a material layer disposed therebetween, where the package cover comprising an inlet opening and an outlet opening.

At block 1086, the method 1000 comprises before or after sealing the package cover 208 to the integrated cooling assembly 203, forming openings in the material layer to fluidly connect the inlet opening and the outlet opening to the cold plate.

The method described above advantageously provides for integrated cooling assemblies that include cooling channel arrangements which increase cooling to semiconductor devices within a device package.

Figure 11:
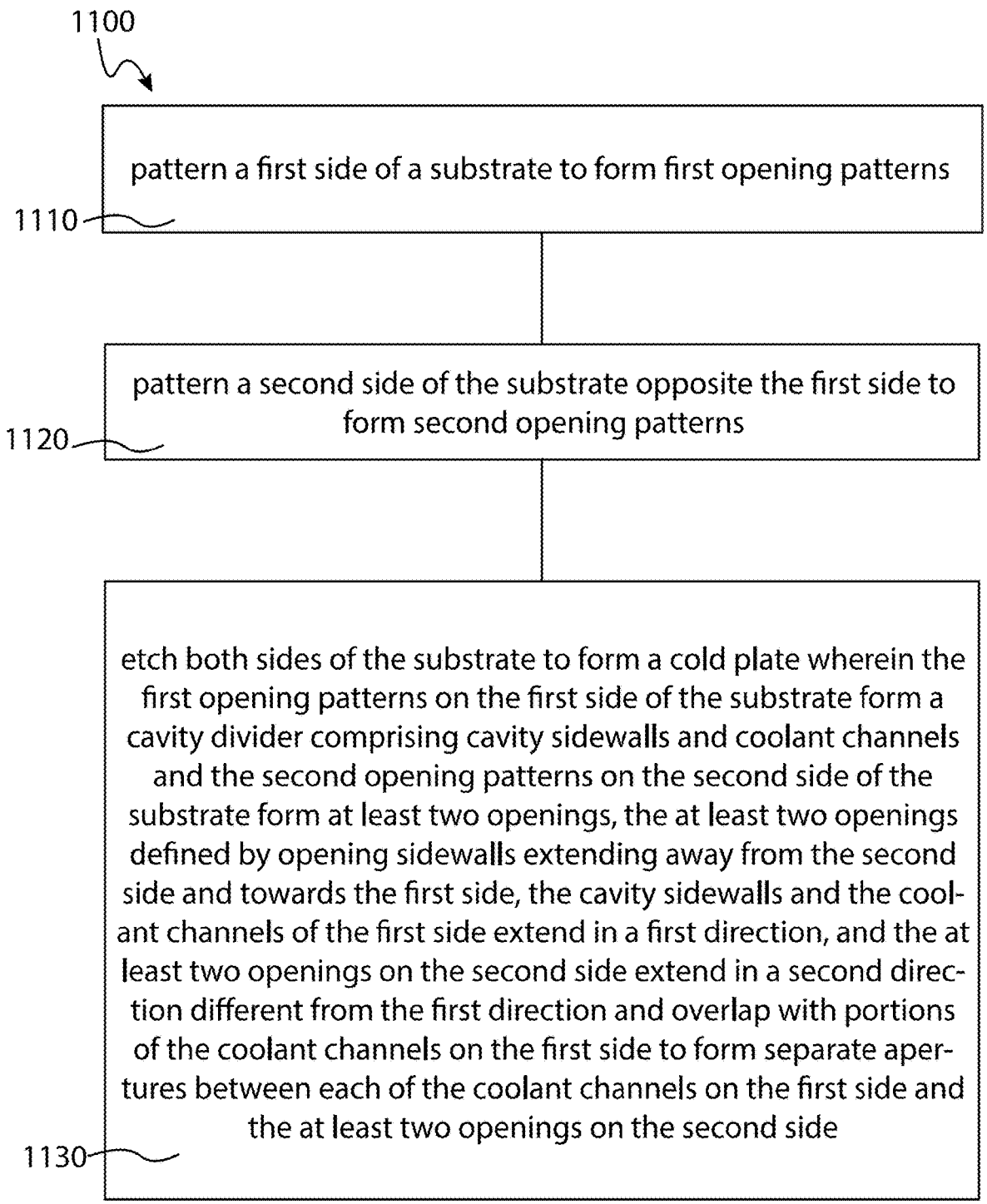
FIG. 11 shows a method that can be used to manufacture cold plates described herein.

FIG. 11 is a flow diagram setting forth a method 1100 of forming a cold plate, according to embodiments of the disclosure.

The method 1100 may include patterning and etching a substrate to form a cold plate. It will be understood that the substrate may be a semiconductor device die or part of a wafer of semiconductor devices.

At block 1110, a first mask layer is patterned on to the first side of the substrate to form first opening patterns. The first mask layer may be patterned on to the first side of the substrate in accordance with the techniques described herein.

At block 1120, a second mask layer is patterned on to the second side of the substrate, the second side of the substrate opposite the first side of the substrate, to form second opening patterns. The second mask layer may be patterned on to the second side of the substrate in accordance with the techniques described herein.

At block 1130, the substrate is etched to form a cold plate which may be a cold plate as described herein. The etching may be a double-sided wet etch, and the etching includes etching first opening patterns on the first side of the substrate form a cavity divider comprising cavity sidewalls and coolant channels and the second opening patterns on the second side of the substrate to form at least two openings.

The at least two openings formed as part of block 1130 are defined by opening sidewalls extending away from the second side and towards the first side. The cavity sidewalls and the coolant channels formed of the first side as part of block 1130 run in a first direction, and the at least two openings on the second side formed as part of block 1130 run in a second direction different from the first direction and overlap with portions of the coolant channels on the first side. The etching of block 1130 gives rise to a continuous aperture between the second side and the first side of the cold plate, and the cavity dividers of the first side extend across the apertures in the cold plate such that a cross-section of each coolant channel is constant along a length of each coolant channel.

The method described above advantageously provides for cold plates including cooling channel arrangements which increase cooling to semiconductor devices within a device package.

The embodiments discussed above are intended to be illustrative and not limiting. One skilled in the art would appreciate that individual aspects of the cooling assemblies, device packages, and methods discussed herein may be omitted, modified, combined, and/or rearranged without departing from the scope of the disclosure.

What is claimed is:

1. An integrated cooling assembly comprising:
   a semiconductor device and a cold plate directly bonded to a backside of the semiconductor device, wherein the cold plate is formed from a single substrate and comprises:

a perimeter sidewall which extends downwardly from a top side of the cold plate to the backside of the semiconductor device to define a perimeter of the cold plate;
a bottom side of the cold plate opposite the top side comprises a cavity divider comprising cavity sidewalls, and wherein:
the cavity divider extends downwardly from the top side towards the backside;
the bottom side, the cavity sidewalls, the perimeter sidewall and the backside of the semiconductor device collectively define coolant channels therebetween;
the coolant channels are exposed to the backside of the semiconductor device; and
the top side of the cold plate comprises at least two openings, the at least two openings defined by opening sidewalls extending away from the top side and towards the bottom side, wherein:
the cavity sidewalls and the coolant channels of the bottom side extend in a first direction;
the at least two openings on the top side extend in a second direction different from the first direction and overlap with portions of the coolant channels on the bottom side to form separate apertures between each of the coolant channels on the bottom side and the at least two openings on the top side; and
one of the at least two openings comprises an inlet and one of the at least two openings comprises an outlet.

2. The integrated cooling assembly of claim 1, wherein the at least two openings allow ingress into and egress out of each of the coolant channels on the bottom side of the cold plate.

3. The integrated cooling assembly of claim 1, wherein each coolant channel has a triangular cross-section defined by respective pairs of opposing cavity sidewalls and the backside of the semiconductor device.

4. The integrated cooling assembly of claim 1, wherein each pair of opposing cavity sidewalls extend downwardly from the top side to a depth of 100 μm-1000 μm.

5. The integrated cooling assembly of claim 1, wherein the bottom side of the cold plate is attached to the semiconductor device by direct dielectric bonds.

6. The integrated cooling assembly of claim 1, wherein the bottom side of the cold plate is attached to the semiconductor device by direct hybrid bonds.

7. The integrated cooling assembly of claim 1, wherein the second direction is substantially perpendicular to the first direction so that the at least two openings on the top side of the cold plate are substantially perpendicular to the coolant channels of the bottom side.

8. The integrated cooling assembly of claim 1, wherein:
the at least two openings on the top side comprise two openings;
the coolant channels comprise a first end and a second end; and
the two openings are disposed vertically in line with the first and second ends of the coolant channels.

9. The integrated cooling assembly of claim 1, wherein:
the at least two openings on the top side comprise three openings;
the coolant channels comprise a first end and a second end; and
two of the three openings are disposed vertically in line with the first and second ends of the coolant channels and a third opening is disposed vertically in line with a midpoint of the coolant channels.

10. The integrated cooling assembly of claim 1, wherein surfaces of the cavity sidewalls are sloped away from the bottom side at an angle less than 90 degrees.

11. The integrated cooling assembly of claim 1, wherein a portion of each coolant channel adjacent to a corresponding aperture from among the apertures in the cold plate includes a tapered section.

12. The integrated cooling assembly of claim 11, wherein the tapered section has a substantially triangular shape.

13. The integrated cooling assembly of claim 1, wherein:
each coolant channel of the plurality of coolant channels comprises a coolant channel inlet opening on a first end and a coolant channel outlet opening on a second end;
a first coolant channel of the plurality of coolant channels comprises a first coolant channel inlet and a first coolant channel outlet;
coolant is only able to enter into the first coolant channel via the first coolant channel inlet; and
the first coolant channel inlet is tapered.

14. The integrated cooling assembly of claim 1, further comprising:
a package substrate upon which the integrated cooling assembly is disposed;
a package cover extending over the integrated cooling assembly so that the integrated cooling assembly is disposed between the package substrate and the package cover, wherein:
the package cover comprises an inlet opening and an outlet opening disposed therethrough; and
each coolant channel is in fluid communication with the inlet opening and the outlet opening.

15. The integrated cooling assembly of claim 14, wherein the integrated cooling assembly further comprises a sealing material layer that surrounds an interface between the semiconductor device and the package substrate.

16. The integrated cooling assembly of claim 1, wherein the integrated cooling assembly comprises plural semiconductor devices and the cold plate is attached to the plural semiconductor devices.

17. The integrated cooling assembly of claim 13, wherein a tapered section of the first coolant channel inlet has a substantially triangular shape.

18. The integrated cooling assembly of claim 1, wherein the at least two openings are etched from the top side of the cold plate, the coolant channels being etched from the bottom side of the cold plate.

19. An integrated cooling assembly comprising:
a semiconductor device; and
a cold plate formed from a single substrate, wherein the cold plate is directly bonded to a backside of the semiconductor device, the cold plate comprising:
a top surface;
a bottom surface, opposite the top surface;
an inlet opening in the top surface forming an inlet channel, wherein the inlet channel extends in a first direction;
an outlet opening in the top surface forming an outlet channel, wherein the outlet channel extends in the first direction; and
a plurality of coolant channels extending in a second direction substantially perpendicular to the first direction, each of the coolant channels being exposed to the backside of the semiconductor device;

wherein each of the coolant channels comprises:
  an inlet aperture between a bottom surface of the inlet channel and an upper surface of the coolant channel, the inlet aperture being positioned at a first end portion of the coolant channel; and
  an outlet aperture between a bottom surface of the outlet channel and the upper surface of the coolant channel, the outlet aperture being positioned at a second end portion of the coolant channel, the second end portion being opposite to the first end portion, the inlet and outlet apertures being the only fluid pathways between the inlet and outlet channels and the coolant channel.

20. An integrated cooling assembly comprising:
a semiconductor device; and
a cold plate formed from a single substrate, wherein the cold plate is directly bonded to a backside of the semiconductor device, the cold plate comprising:
  a top surface;
  a bottom surface, opposite the top surface;
  an inlet opening in the top surface forming an inlet channel, wherein the inlet channel extends in a first direction;
  a first outlet opening in the top surface forming a first outlet channel, wherein the first outlet channel extends in the first direction;
  a second outlet opening in the top surface forming a second outlet channel, wherein the second outlet channel extends in the first direction;
  a plurality of coolant channels extending in a second direction substantially perpendicular to the first direction, each of the coolant channels being exposed to the backside of the semiconductor device;
wherein each of the coolant channels comprises:
  an inlet aperture between a bottom surface of the inlet channel and an upper surface of the coolant channel, the inlet aperture being positioned between first and second opposing end portions of the coolant channel;
  a first outlet aperture between a bottom surface of the first outlet channel and the upper surface of the coolant channel, the first outlet aperture being positioned at the first end portion of the coolant channel;
  a second outlet aperture between a bottom surface of the second outlet channel and the upper surface of the coolant channel, the second outlet aperture being positioned at the second end portion of the coolant channel, the inlet aperture and the first and second outlet apertures being the only fluid pathways between the inlet and outlet channels and the coolant channel.

* * * * *